(12) United States Patent
Adachi et al.

(10) Patent No.: US 9,859,681 B2
(45) Date of Patent: Jan. 2, 2018

(54) OPTICAL DEVICE AND LIGHT IRRADIATION APPARATUS

(71) Applicants: Kazuhiko Adachi, Miyagi (JP); Naoto Jikutani, Miyagi (JP)

(72) Inventors: Kazuhiko Adachi, Miyagi (JP); Naoto Jikutani, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 15/134,945

(22) Filed: Apr. 21, 2016

(65) Prior Publication Data

US 2016/0336716 A1 Nov. 17, 2016

(30) Foreign Application Priority Data

May 13, 2015 (JP) ................. 2015-098303

(51) Int. Cl.
*H01L 33/00* (2010.01)
*H01S 5/022* (2006.01)
*G02B 3/00* (2006.01)
*H01S 5/42* (2006.01)
*H01S 5/227* (2006.01)
(Continued)

(52) U.S. Cl.
CPC ...... *H01S 5/02288* (2013.01); *B23K 26/0648* (2013.01); *G02B 3/0075* (2013.01); *G02B 6/423* (2013.01); *H01L 33/48* (2013.01); *H01L 33/483* (2013.01); *H01L 33/486* (2013.01); *H01L 33/58* (2013.01); *H01L 33/60* (2013.01); *H01S 5/02252* (2013.01); *H01S 5/02469* (2013.01); *H01S 5/2275* (2013.01); *H01S 5/423* (2013.01); *G02B 6/4204* (2013.01);
(Continued)

(58) Field of Classification Search
None
See application file for complete search history.

(56) References Cited

U.S. PATENT DOCUMENTS 5,940,564 A 8/1999 Jewell
6,639,931 B1 10/2003 Dowd et al.
(Continued)

FOREIGN PATENT DOCUMENTS

EP 1 130 720 A1 9/2001
JP H09-001461 1/1997
(Continued)

OTHER PUBLICATIONS

European search report dated Sep. 29, 2016 in corresponding European Patent Application No. 16168784.3.

*Primary Examiner* — Minh-Loan Tran
(74) *Attorney, Agent, or Firm* — Cooper & Dunham LLP

(57) ABSTRACT

An optical device includes a semiconductor element configured to emit emission light or to receive incident light, including a first fitting part including a portion having a convex shape in a first region; an optical member arranged on an optical path of the emission light emitted from the semiconductor element or the incident light entering the semiconductor element, including a second fitting part fitted to at least a part of the portion having the convex shape, the first region being opposed to the optical member; and a joint part that joins the semiconductor element and the optical member, arranged between the first fitting part and the second fitting part.

12 Claims, 16 Drawing Sheets

1A

(51) Int. Cl.
  *H01S 5/024* (2006.01)
  *B23K 26/06* (2014.01)
  *H01L 33/60* (2010.01)
  *H01L 33/48* (2010.01)
  *H01L 33/58* (2010.01)
  *G02B 6/42* (2006.01)
  *H01S 5/00* (2006.01)

(52) U.S. Cl.
  CPC .. *G02B 6/4239* (2013.01); *H01L 2924/16235* (2013.01); *H01S 5/005* (2013.01)

(56) References Cited

U.S. PATENT DOCUMENTS

| | | | |
|---|---|---|---|
| 6,738,403 B2 | 5/2004 | Kuniyasu et al. | |
| 7,324,717 B2 | 1/2008 | Chua et al. | |
| 7,729,400 B2 | 6/2010 | Tanaka et al. | |
| 7,991,033 B2 | 8/2011 | Hara et al. | |
| 8,385,381 B2 | 2/2013 | Maeda et al. | |
| 8,421,838 B2 | 4/2013 | Yamaguchi et al. | |
| 8,697,459 B2 | 4/2014 | Adachi et al. | |
| 8,803,936 B2 | 8/2014 | Adachi et al. | |
| 2004/0101020 A1* | 5/2004 | Bhandarkar | G02B 6/4292 372/109 |
| 2006/0051029 A1 | 3/2006 | Aizpuru et al. | |
| 2014/0186032 A1* | 7/2014 | Louderback | H04B 10/0799 398/38 |
| 2016/0043528 A1 | 2/2016 | Adachi et al. | |

FOREIGN PATENT DOCUMENTS

| | | |
|---|---|---|
| JP | H09-260539 | 10/1997 |
| JP | 2674214 | 11/1997 |
| JP | 2000-349384 | 12/2000 |
| JP | 3183247 | 7/2001 |
| JP | 2001-267681 | 9/2001 |
| JP | 2001-284704 | 10/2001 |
| JP | 2001-291924 | 10/2001 |
| JP | 2003-324228 | 11/2003 |
| JP | 2004-047855 | 2/2004 |
| JP | 2004-096091 | 3/2004 |
| JP | 2004-146722 | 5/2004 |
| JP | 2004-186322 | 7/2004 |
| JP | 3566902 | 9/2004 |
| JP | 2004-288713 | 10/2004 |
| JP | 2005-014141 | 1/2005 |
| JP | 2005-038970 | 2/2005 |
| JP | 2005-057188 | 3/2005 |
| JP | 2005-086054 | 3/2005 |
| JP | 2005-093804 | 4/2005 |
| JP | 2005-106882 | 4/2005 |
| JP | 2005-191373 | 7/2005 |
| JP | 3687290 | 8/2005 |
| JP | 2006-126754 | 5/2006 |
| JP | 2006-202998 | 8/2006 |
| JP | 2007-103576 | 4/2007 |
| JP | 2007-142425 | 6/2007 |
| JP | 2007-201398 | 8/2007 |
| JP | 3955925 | 8/2007 |
| JP | 4085970 | 5/2008 |
| JP | 4363016 | 11/2009 |
| JP | 4381017 | 12/2009 |
| JP | 2010-034506 | 2/2010 |
| JP | 2011-124541 | 6/2011 |
| JP | 2011-151357 | 8/2011 |
| JP | 2011-216852 | 10/2011 |
| JP | 2013-016617 | 1/2013 |
| WO | WO 2009/154160 A1 | 12/2009 |

* cited by examiner

OPTICAL DEVICE AND LIGHT IRRADIATION APPARATUS

CROSS-REFERENCE TO RELATED APPLICATIONS

The present application claims benefit of priority under 35 U.S.C. §119 of Japanese Patent Application No. 2015-098303, filed May 13, 2015. The contents of said application are incorporated herein by reference in their entirety.

BACKGROUND OF THE INVENTION

1. Field of the Invention

The disclosures herein generally relate to an optical device and a light irradiation apparatus.

2. Description of the Related Art

Recently, intensive investigations have started on high-power lasers, for such as various kinds of optical instruments, laser projectors or light source lasers for laser processing machines. Such high-power lasers have achieved high output by focusing light from surface-emitting laser arrays, for example. A surface-emitting laser is suitable for a light source of a high-power laser according to a characteristic that light is emitted in a direction orthogonal to a substrate, a characteristic of easy integration and a characteristic of being easily testable. As a configuration of the high-power laser, for example, a configuration has been known in which a collimator lens including a microlens array is arranged in a light emission direction of a surface-emitting laser array which is a light source and furthermore a light focusing lens is arranged.

A surface-emitting laser array has a configuration, in which surface-emitting lasers each having mesa structures several tens of micrometers square as unit elements are arranged in a square lattice shape or in a hexagonal closed packed lattice shape. On the other hand, a microlens array for generating collimator light from the light emitted from the surface-emitting laser array is made of synthetic quartz or the like and is formed corresponding to the unit element of the surface-emitting laser array.

The surface-emitting laser array and the microlens array, as described above, require high mounting accuracy of ±tens of micrometers in three directions of X, Y and Z for mounting the microlens on the surface-emitting laser in order to improve utilization efficiency of light of the surface-emitting laser. Then, various investigations for improving accuracy of mounting a microlens on a surface-emitting laser have been performed. Specific examples in the related art of aligning a microlens with a surface-emitting laser with high accuracy are as follows:

The first example in the related art of aligning a microlens with a surface-emitting laser is a photonic device. The photonic device is a device in which the surface-emitting laser and the microlens are integrated. The photonic device has a microlens structure, in which plural leg portions are provided on a substrate on which the surface-emitting laser is formed in order to keep a predetermined distance from the surface-emitting laser.

In the photonic device, as described above, the leg portions, which are integrated with the microlens structure and are extended, are fixed on a surface of the substrate on which the surface-emitting laser is formed. In addition, for aligning in the XY-directions, two kinds of positioning methods, i.e. positioning while monitoring images of the surface-emitting laser and of the lens and positioning while causing the surface-emitting laser to emit light and receiving light having transmitted through the lens, are disclosed (See, for example, Japanese Published Patent Application No. 2007-142425).

The second example in the related art of aligning a microlens with a surface-emitting laser is an optical element mounting apparatus. In the optical element mounting apparatus, a protrusion of an alignment reference portion is integrally formed on one side of a microlens array substrate. Then, a depression of the alignment reference portion is integrally formed on one side of a surface-emitting laser array substrate, and both the alignment reference portions are fitted to each other. In this optical element mounting apparatus, mounting with high accuracy is required because a light emission unit of the surface-emitting laser and a microlens have structures corresponding one-to-one to each other.

In addition, in the above-described optical element mounting apparatus, the protrusion on the side of the microlens is formed integrally with the microlens upon resin molding of the microlens, and the depression on the substrate on the side of the surface-emitting laser array is manufactured by etching using a photolithography technology of a semiconductor process (See, for example, Japanese Published Patent Application No. 2004-288713).

SUMMARY OF THE INVENTION

It is an object of at least one embodiment of the present invention to provide an optical device and a light irradiation apparatus that substantially obviate one or more problems caused by the limitations and disadvantages of the related art.

In one embodiment, an optical device includes a semiconductor element configured to emit emission light or to receive incident light, including a first fitting part including a portion having a convex shape in a first region; an optical member arranged on an optical path of the emission light emitted from the semiconductor element or the incident light entering the semiconductor element, including a second fitting part configured to be fitted to at least a part of the portion having the convex shape, the first region being opposed to the optical member; and a joint part configured to join the semiconductor element and the optical member, arranged between the first fitting part and the second fitting part.

In another embodiment, a light irradiation apparatus for irradiating an object with light includes an optical device configured to emit the light; and an optical system arranged on an optical path of the light emitted from the optical device, and configured to guide the light to the object. The optical device includes a semiconductor element configured to emit emission light or to receive incident light, including a first fitting part including a portion having a convex shape in a first region; an optical member arranged on an optical path of the emission light emitted from the semiconductor element or the incident light entering the semiconductor element, including a second fitting part configured to be fitted to at least a part of the portion having the convex shape, the first region being opposed to the optical member; and a joint part configured to join the semiconductor element and the optical member, arranged between the first fitting part and the second fitting part. The semiconductor element is a light-emitting element configured to emit the light.

BRIEF DESCRIPTION OF THE DRAWINGS

Other objects and further features of embodiments will be apparent from the following detailed description when read in conjunction with the accompanying drawings, in which.

DESCRIPTION OF THE PREFERRED EMBODIMENTS

Figure 1A:
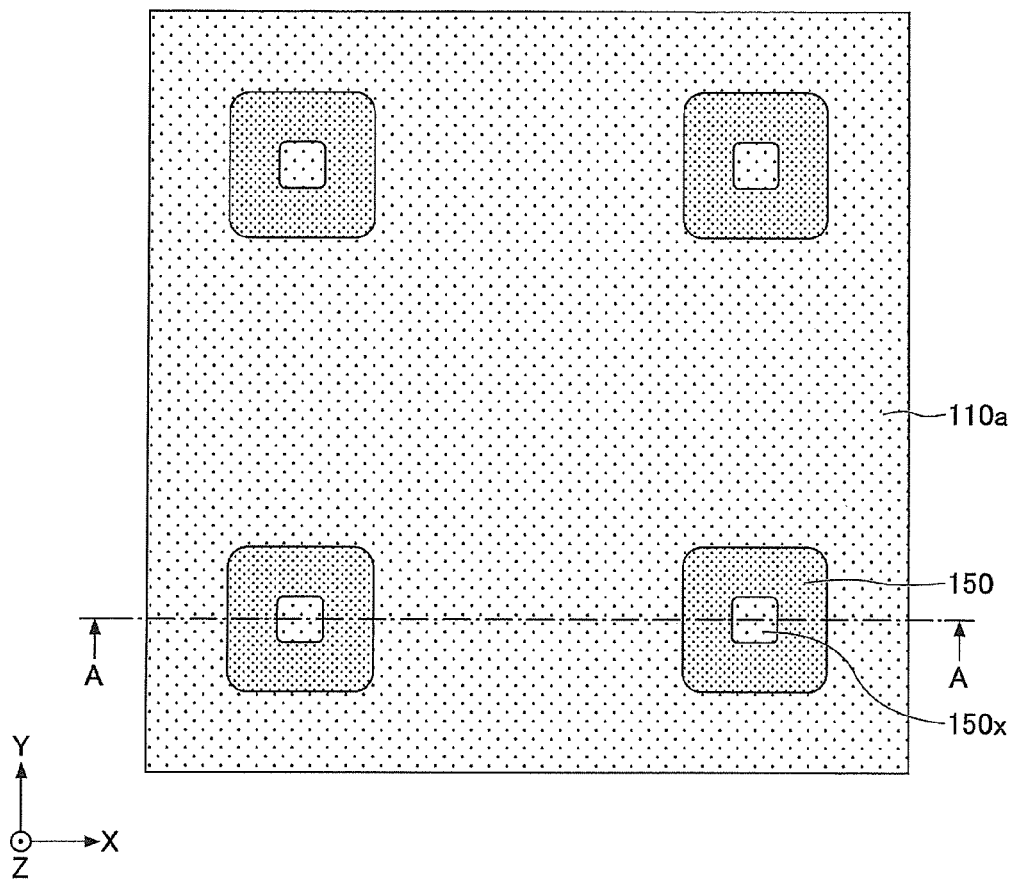
FIGS. 1A and 1B are diagrams depicting an example of a first structure.

In the following, embodiments of the present invention will be described with reference to the accompanying drawings. In the respective drawings, the same reference numeral is assigned to the same component, and duplicate explanation will be omitted.

<Self-Alignment>

Figure 1B:
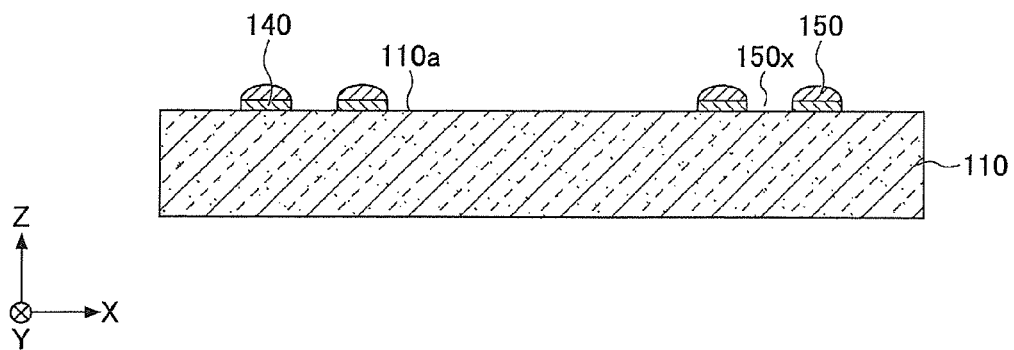

At first, a self-alignment method according to the embodiments will be described for a case of joining a first structure 110a and a second structure 210a as an example. FIGS. 1A and 1B are diagrams depicting an example of the first structure 110a. FIG. 1A is a plan view, and FIG. 1B is a cross-sectional view cut along a line A-A in FIG. 1A. For the sake of convenience, in the plan view of FIG. 1A, the respective parts are appropriately shown with satin patterns (this is also applicable to other plan views).

Here, for the sake of convenience, a side of the second structure 210 will be referred to an upper side or one side, and a side of the first structure 110 will be referred to a lower side or another side. Moreover, a face of each side on the side of the second structure 210 will be referred to first face or a top face, and a face on the side of the first structure 110 will be referred to a second face or a bottom face. Moreover, planar view is assumed when viewing an object in a direction orthogonal to first face 110a of the first structure 110, and a planar shape is assumed when viewing a shape of the object in the direction orthogonal to the first face 110a of the first structure 110. Moreover, in each drawing, the direction orthogonal to the first face 110 of the first structure is assumed to be Z-direction. In the planar view, a direction parallel to a side of the first face 110a of the first structure 110 is assumed to be X-direction. A direction orthogonal to the X-direction and the Z-direction will be Y-direction. This assumption will be similarly applied to the embodiments, which will be described later.

A planar shape of the first structure 110 is, for example, a quadrangle. At four corners of the first face 110a of the first structure 110, for example, adhesive fixture regions 140 are formed. Here, the four corners of the first face 110a of the first structure 110 mean regions adjacent to the corner portions of the first face 110a of the first structure 110. The adhesive fixture regions 140 may not necessarily be provided so as to contact margins of the first face 110a of the first structure 110. Another structure or the like also has the above-described configuration.

A planar shape of each of the adhesive fixture regions 140 may be a frame shape. On the adhesive fixture region 140, a bump 150, which is a convex portion, is formed. At a center of the bump 150, an aperture 150x is provided, and a part surrounded by the bump 150 is a concave portion having a box shape. A cross section of the bump 150 has two shapes, which are parts of a circle (hereinafter, referred to as partial circles). Two partial circles are arranged in a state of being separated from each other. In this way, in the first structure 110, a fitting part having a concave shape surrounded by the bump 150, which is a convex portion, is formed. The partial circle may be a semicircle (This property can be applied similarly in the following).

In FIG. 1A, the planar shape of the aperture 150x is approximately a square. But, the present invention is not limited to this. The planar shape of the aperture 150x may be a regular n-sided polygon, where n is a positive integer greater than or equal to three, or a circle. Moreover, a planar shape of an outer edge of the bump 150 may be appropriately selected in accordance with the planar shape of the aperture 150x.

Figure 2A:
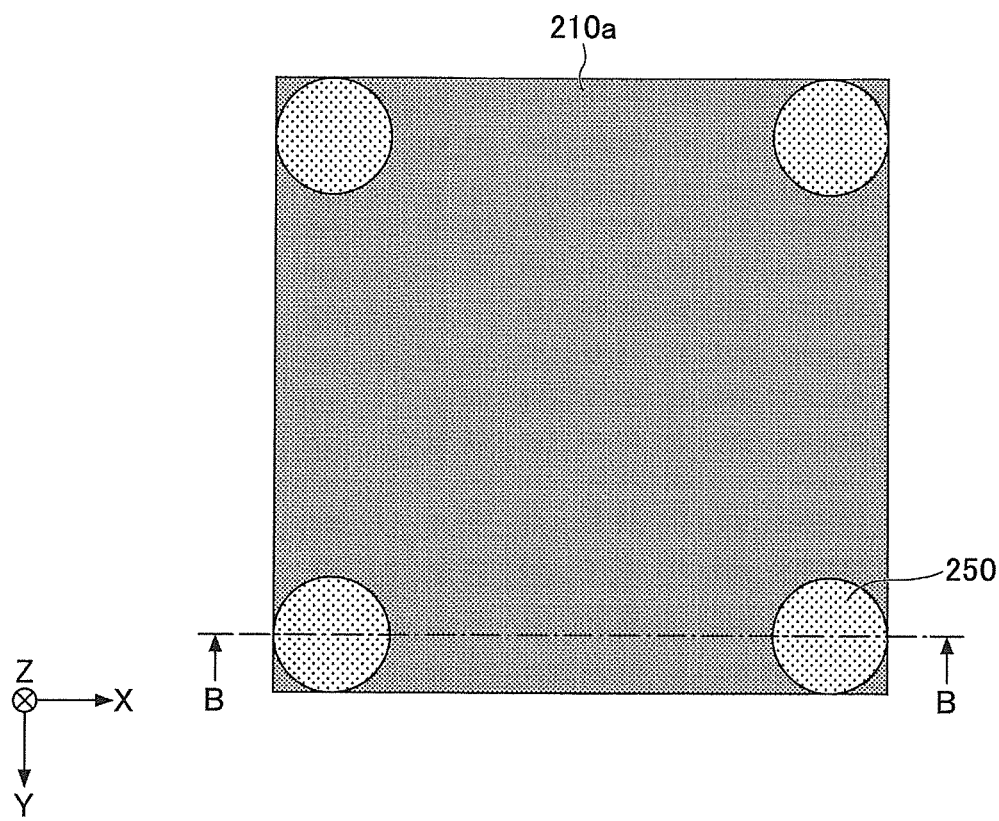
FIGS. 2A and 2B are diagrams depicting an example of a second structure.
Figure 2B:
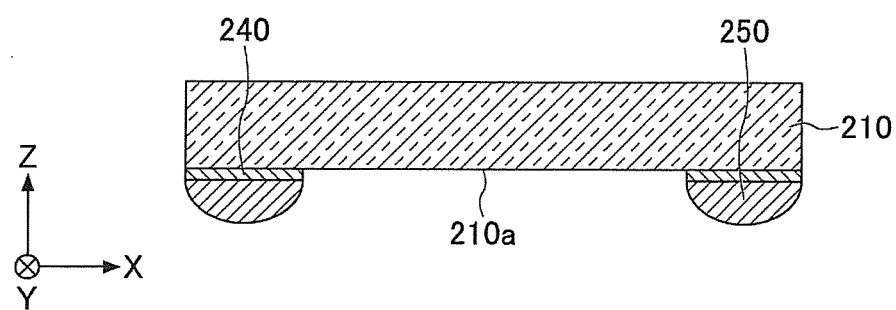

FIGS. 2A and 2B are diagrams depicting an example of the second structure. FIG. 2A is a bottom view, and FIG. 2B is a cross-sectional view cut along a line B-B in FIG. 2A. A planar shape of the second structure 210 is, for example, a quadrangle. At four corners of the first face 210a of the second structure 210, for example, adhesive fixture regions 240 are formed.

A planar shape of each of the adhesive fixture regions 240 may be a circular shape. On the adhesive fixture region 240, a bump 250, which is a convex portion, is formed. A cross section of the bump 250 may be a shape of a partial circle. The bump 250 may be hemispherical. In this way, in the second structure 210, a fitting part having the bump 250, which is a convex portion, is formed.

The adhesive fixture regions 140 and 240 may be formed with, for example, a metallic material such as gold (Au). Moreover, the bumps 150 and 250 may be formed with, for example, a metallic material such as a solder material. By melting a predetermined amount of a solder material on a pattern formed with a metallic material having a predetermined shape, a bump shape, which is determined by a surface tension upon curing, can be formed.

Functions of the first structure 110 and the second structure 210 are not particularly limited. The first structure 110 may be, for example, a semiconductor element. The semiconductor element includes, for example, a light-emitting element that emits light, a light-receiving element that receives light or the like. In a case where the first structure 110 is a light-emitting element or a light-receiving element, the second structure 210 may be, for example, an optical member, which is arranged on an optical path of light emitted from the light-emitting element or of light entering the light-receiving element.

Figure 3:
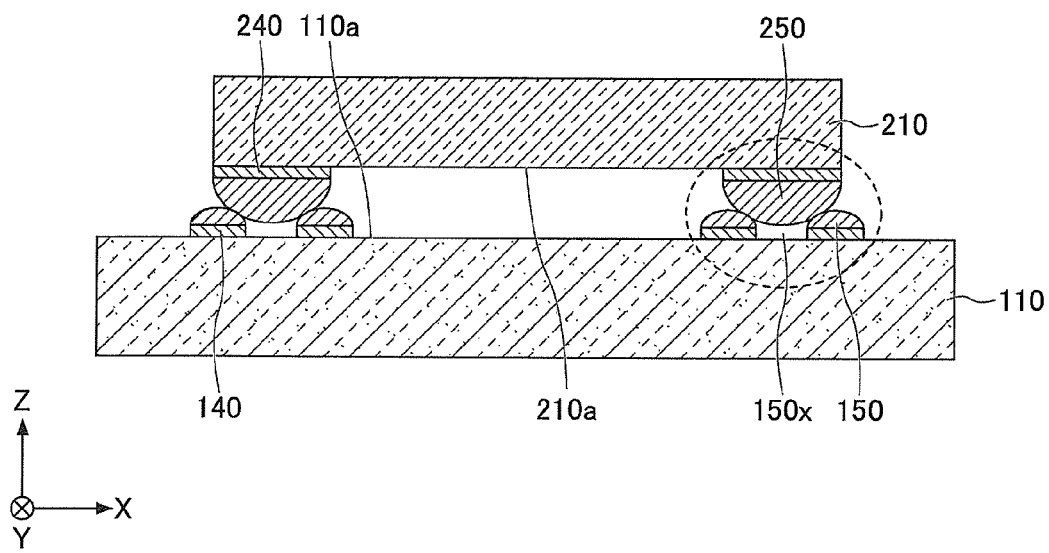
FIG. 3 is a cross-sectional view depicting an example state after the first structure is aligned with the second structure.

FIG. 3 is a cross-sectional view depicting an example state after the first structure is aligned with the second structure. A part enclosed by a dashed curve in FIG. 3 is a fitting structure. As shown in FIG. 3, a self-alignment is performed by dropping the bump 250, which is a convex portion, in the concave portion having a box shape surrounded by the bump 150, which is a convex portion.

By using a solder material as the bumps 150 and 250, there is an advantage that some of the bumps are formed on surfaces of the first structure 110 and the second structure 210 and it is not necessary to scrape the first structure 110 and the second structure 210. Moreover, there is also an advantage that a bump shape in the case of using a solder material depends only on a surface tension of solder and reproducibility of a bump shape is quite high.

Figure 4:
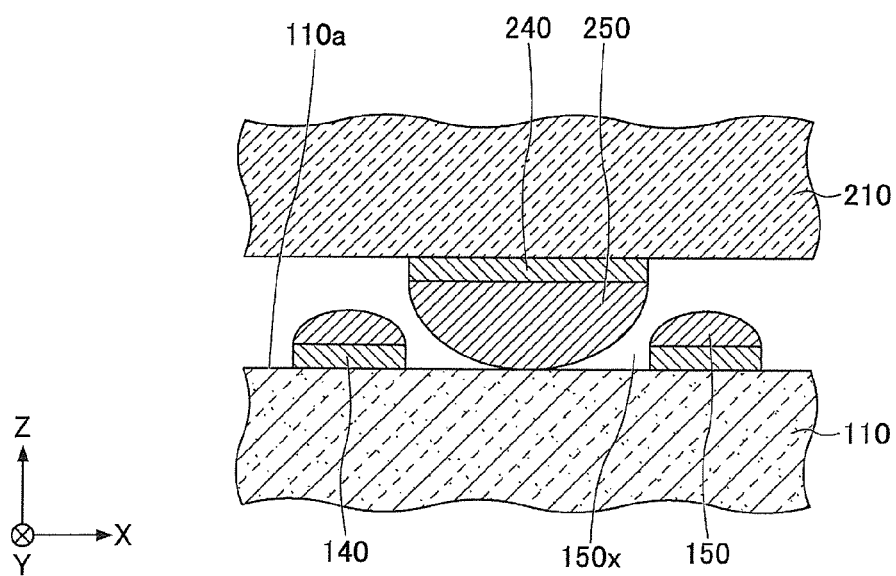
FIG. 4 is a cross-sectional view depicting an example improper fitting state (comparative example)

FIG. 4 is a cross-sectional view depicting an example improper fitting state (comparative example). As shown in FIG. 4, under a condition that the bump 250 does not have contact with two partial circles of the bump 150, and that the bump 250 gets contact with the first face 110a of the first structure 110 which is exposed in the aperture 150x of the bump 150, a position displacement occurs in the second structure 210. This is an improper design as a fitting structure.

That is, a boundary condition for establishing self-alignment of a fitting method is a state where, in a cross section of the fitting structure, the bump 250 has contact with the two partial circles of the bump 150, and a vertex of the bump 250 gets contact with the first face 110a of the first structure 110. Therefore, as a condition for performing a stable self-alignment, a state where, in the cross section of the fitting structure, the bump 250 has contact with the two partial circles of the bump 150, and the vertex of the bump 250 does not get contact with the first face 110a of the first structure 110, is selected.

Figure 5:
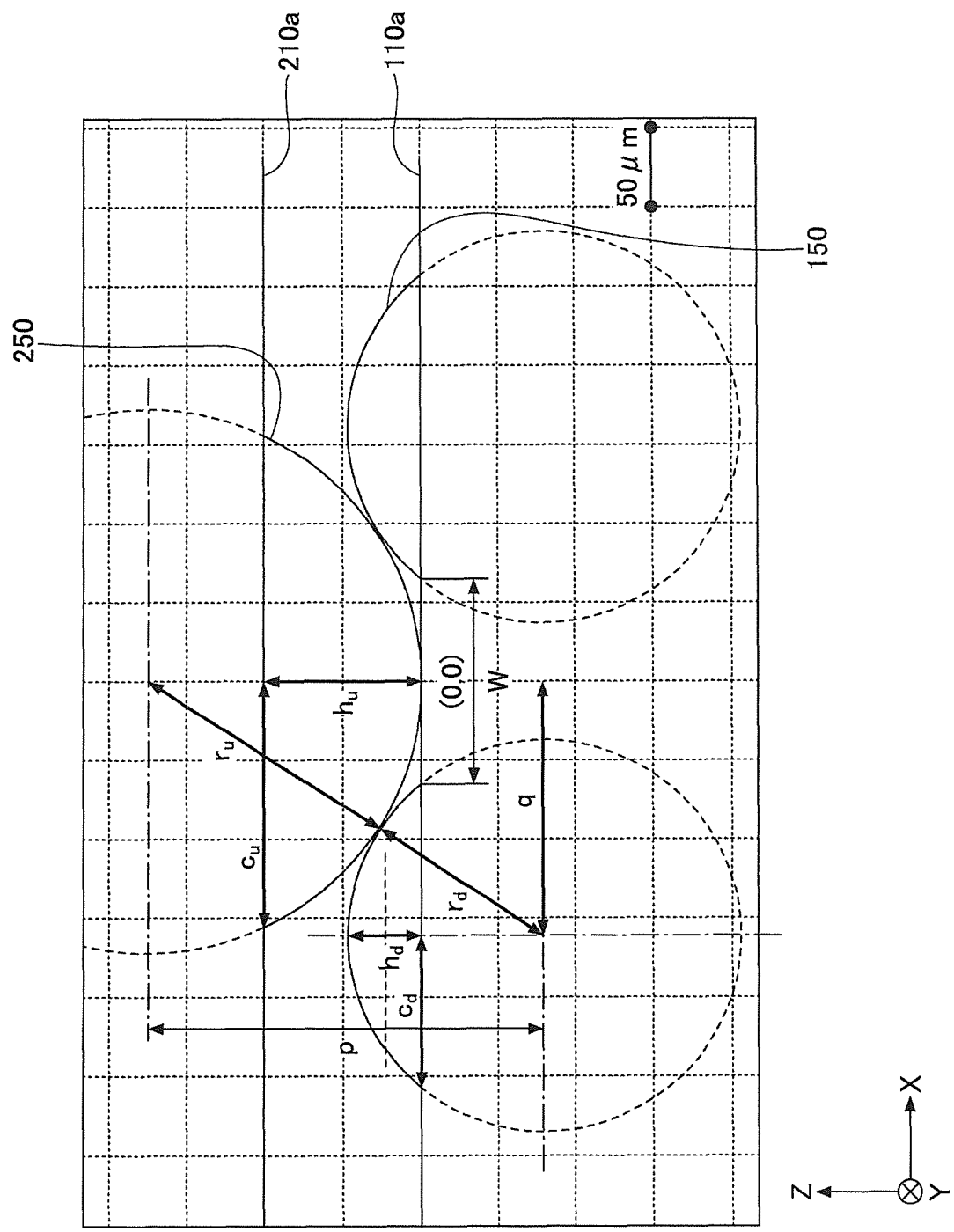
FIG. 5 is a diagram for explaining a size of each member under a condition for carrying out a stable self-alignment.

FIG. 5 is a diagram for explaining a size of each member under the condition for carrying out the stable self-alignment, and shows a cross section of the fitting structure. In FIG. 5, "r" is a radius, "h" is a height of the partial circle in the cross section of each bump projecting to a surface of each structure, "q" is a distance of a half of a distance between centers of virtual circles of the two bumps in the cross section of the bump 250. Moreover, "p" is a distance between centers of virtual circles of the bump 150 and the bump 250, and "c" is a half of a width of a region where a solder is wet in each adhesive fixture region. Suffixes "d" and "u" represent the side of the concave shape and the side of the convex shape, respectively.

In a case of assuming a circle passing through three points of both ends of a pattern width 2c and a height h, as a virtual circle expressing each bump shape, an equation of the virtual circle for the bump 250 is expressed by Equation (1) and an equation of the virtual circle for the bump 150 is expressed by Equation (2), as follows:

[Equation 1]

$$x^2 + \left(y - \frac{c_u^2 + h_u^2}{2h_u}\right)^2 = \left(\frac{c_u^2 + h_u^2}{2h_u}\right)^2 = r_u^2 \tag{1}$$

[Equation 2]

$$x^2 + \left(y - \frac{c_d^2 - h_d^2}{2h_d}\right)^2 = \left(\frac{c_d^2 + h_d^2}{2h_d}\right)^2 = r_d^2 \tag{2}$$

Furthermore, in a case where the respective c and h are given, the distance $q_0$ which is a half of the distance between the centers of the two virtual circles in the state where the vertex of the bump 250 with a radius $r_u$ gets contact with the first face 110a of the first structure 110, and has contact with the two partial circles of the bump 150 with a radius $r_d$, is given by Equation (3) as follows:

[Equation 3]

$$q_0 = \sqrt{(r_d + r_u)^2 - p^2} \tag{3}$$

where $p = r_u + r_d - h_d$.

Equation (3) is the boundary condition for the self-alignment. Therefore, in order to enable the self-alignment method according to the embodiments, it is necessary only to select a configuration in which the vertex of the bump 250 does not get contact with the first face 110a of the first structure 110 which is exposed in the aperture 150x and has contact with the two partial circles of the bump 150, using the above-described boundary condition. Moreover, an aperture width "W" of the aperture 150x is expressed by the following Equation (4):

[Equation 4]

$$W = 2(q - c_d) \tag{4}$$

In this way, the self-alignment method according to the embodiments is a fitting method for forming a convex and concave structure on surfaces of structures which are joined each other. By forming bumps including a predetermined amount of solder material on a metallic pattern, because a bump shape depends only on a surface tension upon the solder material curing, a bump shape with quite high reproducibility can be formed with good controllability. As a result, it is possible to enable aligning with high accuracy by the self-alignment.

Moreover, for example, in the fitting method described as the second example of the related art in the background of the invention, because it is necessary to form concavity and convexity by processing an object to be joined, the formation may be difficult depending on its material. Moreover, because a height of the convexity and a depth of the concavity is less than or equal to a thickness of the substrate, it may be difficult to realize a practical depth of the concavity or a practical height of the convexity so that a positional displacement does not occur. Furthermore, an adverse effect to a device due to formation of a depression for fitting on the surface of the substrate on the side of the surface emitting laser array, or damage on the surface of the device due to etching is a concern.

In contrast, in the self-alignment method according to the embodiments, because it is not necessary to scrape the first and the second structures, a concave shape and a convex shape can be formed easily, and an influence to the device can be suppressed. Moreover, it is preferable that an expensive apparatus for aligning is not necessary. Furthermore, because the alignment is performed at room temperature, even when a device is formed in the first structure and in the second structure, neither the first nor the second structure is damaged, and it is preferable.

<First Embodiment>

In a first embodiment, an example of applying the above-described self-alignment method to a surface-emitting laser device 1, which is an example of an optical device, will be described. In the surface emitting laser device 1, a surface emitting laser array substrate 10 corresponds to the above-described first structure, and a microlens array substrate 20 corresponds to the above-described second structure.

[Structure of Surface-Emitting Laser Device]

Figure 6:
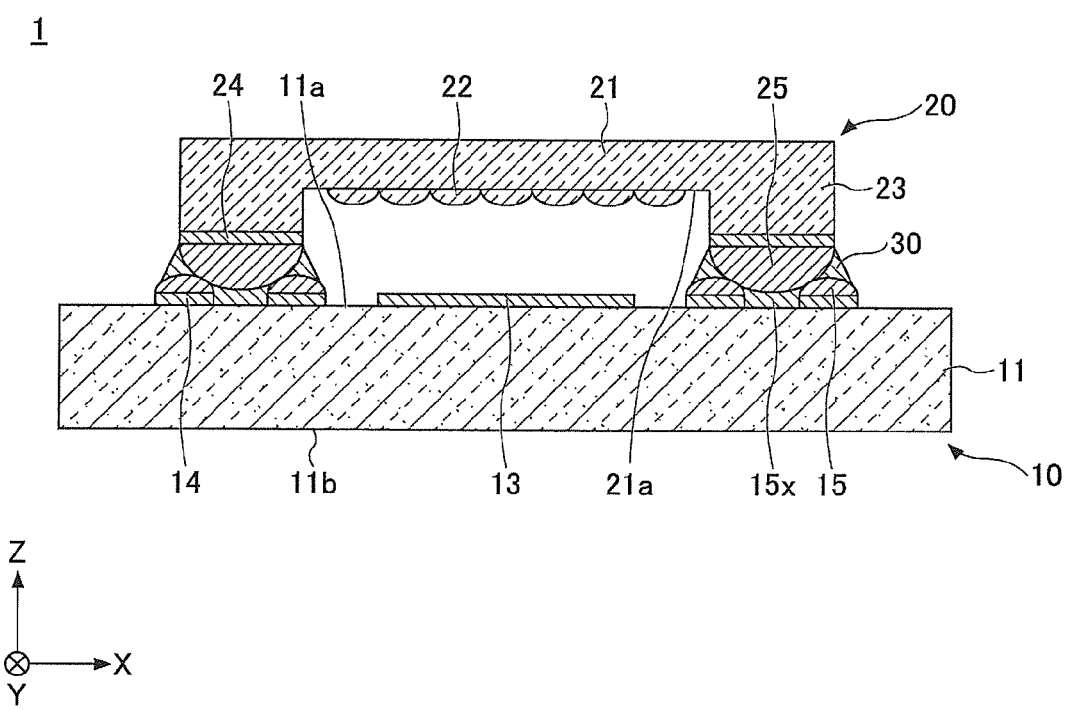
FIG. 6 is a cross-sectional view depicting an example main part of a surface-emitting laser device according to a first embodiment.
Figure 7A:
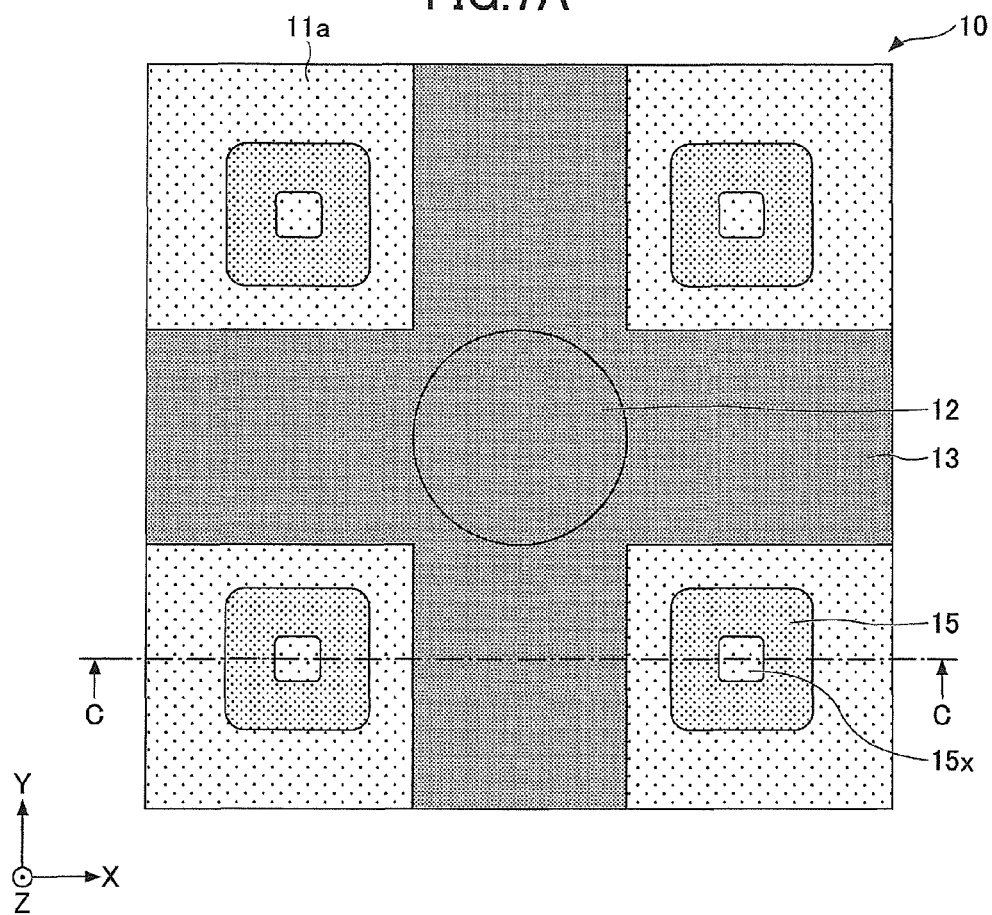
FIGS. 7A and 7B are diagrams depicting an example of a surface-emitting laser array substrate according to the first embodiment.
Figure 7B:
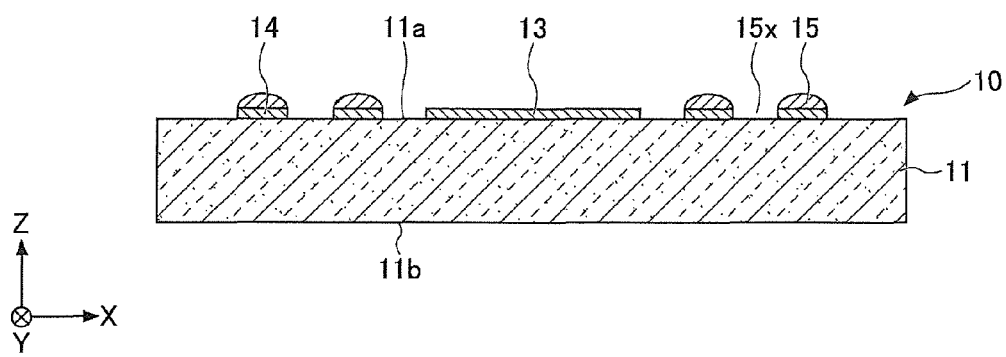
Figure 8A:
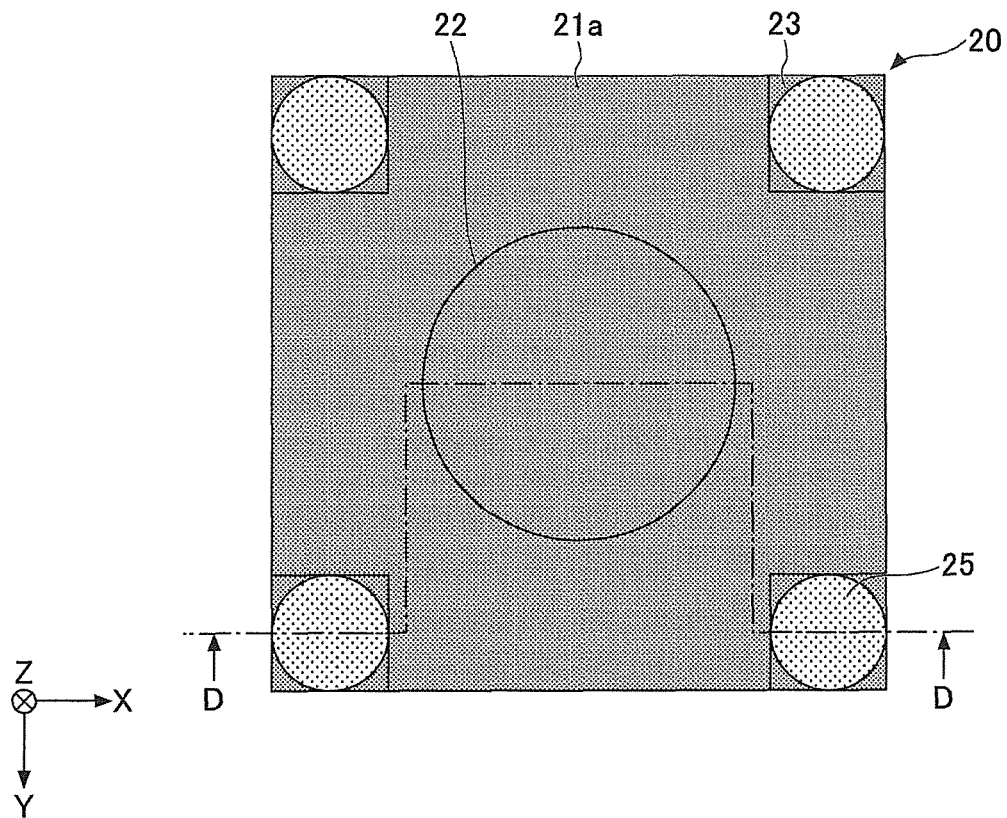
FIGS. 8A and 8B are diagrams depicting an example of a microlens array substrate according to the first embodiment.
Figure 8B:
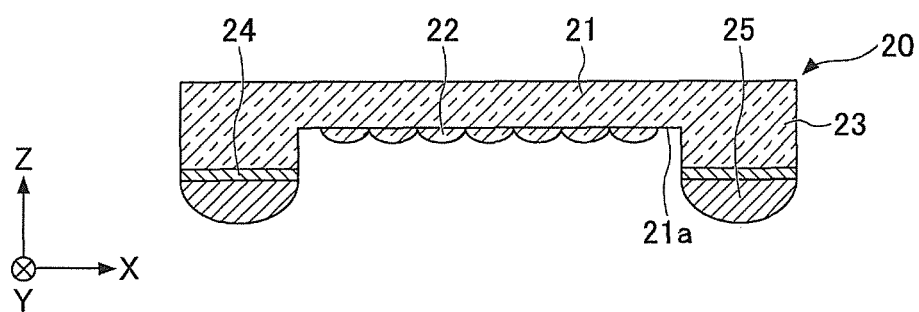

FIG. 6 is a cross-sectional view depicting an example main part of the surface-emitting laser device 1 according to the first embodiment. FIGS. 7A and 7B are diagrams depicting an example of the surface-emitting laser array substrate 10 according to the first embodiment. FIG. 7A is a planar view, and FIG. 7B is a cross-sectional view cut along a line C-C in FIG. 7A. FIGS. 8A and 8B are diagrams depicting an example of the microlens array substrate 20 according to the first embodiment. FIG. 8A is a planar view, and FIG. 8B is a cross-sectional view cut along a line D-D in FIG. 8A.

As shown in FIG. 6, the surface-emitting laser device 1 includes the surface-emitting laser array substrate 10, the microlens array substrate 20 and a joint part 30. The microlens array substrate is mounted on the surface-emitting laser array substrate 10 via the joint part 30. Moreover, the surface-emitting laser array substrate 10 can be mounted, for example, on a surface of a heat sink. For the sake of convenience, in FIG. 6, for the surface-emitting laser array substrate 10 a cross section is shown in FIG. 7B, and for the microlens array substrate 20 a cross section is shown in FIG. 8B.

As shown in FIGS. 7A and 7B, in the surface-emitting laser array substrate 10, a surface-emitting laser array 12 is formed approximately at center of a first face 11a (top face) of a semiconductor substrate 11 including n-type gallium arsenide (GaAs) or the like. The surface-emitting laser array 12 includes a plurality of surface-emitting lasers, each of which is a unit element having a mesa structure, arranged in a one-dimensional or two-dimensional array shape. A planar shape of the semiconductor substrate 11 is, for example, a quadrangle. The surface-emitting laser is, for example, a VCSEL (Vertical Cavity Surface Emitting Laser) which emits light in the direction orthogonal to the first face 11a of the semiconductor substrate 11 (Z-direction).

In the surface-emitting laser array substrate 10, an anode electrode 13 is formed on the first face 11a of the semiconductor substrate 11. The anode electrode 13 is obtained by extending anode electrodes of the surface emitting lasers, each of which is a unit element of the surface-emitting laser array 12. Moreover, on a second face 11b (bottom face) of the semiconductor substrate 11, a cathode electrode is formed.

Moreover, at four corners of the first face 11a of the semiconductor substrate 11, for example, adhesive fixture regions 14 are formed. A planar shape of the adhesive fixture region 14 can be, for example, a frame shape. The adhesive fixture region 14 can be formed, for example, with gold (Au). The adhesive fixture region 14 may be formed, for example, with laminated films, in which titanium (Ti)/platinum (Pt)/gold (Au) are laminated in the order from a side of the first face 11a of the semiconductor substrate 11. However, the adhesive fixture region 14 may be formed of a material other than the above-described material, in the case where it is a material which becomes wet with the bump 15 more easily than the material of the semiconductor substrate 11 (for example, gallium arsenide).

Meanwhile, since the semiconductor substrate 11 has low electric conductivity, the anode electrode 13 and the adhesive fixture region 14 which are formed so as to be separated from each other on the first face 11a of the semiconductor substrate 11 are insulated electrically from each other. In order to insulate more firmly the anode electrode 13 and the adhesive fixture region 14 from each other, an insulation film may be formed on the first face 11a of the semiconductor substrate 11 and the adhesive fixture region 14 may be formed on it. Moreover, by forming the anode electrode 13 and the adhesive fixture region 14 so as to be separated from each other, it is possible to prevent a wet solder from spreading to the anode electrode 13 upon forming a bump 15 with a solder material on the adhesive fixture region 14.

The bump 15 is formed on the adhesive fixture region 14. At a center of the bump 15, an aperture 15x is provided, and a part surrounded by the bump 15 is a concave portion having a box shape. A cross section of the bump 15 may have two partial circles, which are arranged separately from each other. The bump 15 may be formed with, for example, a solder material such as AuSn. In this way, in the surface-emitting laser array substrate 10, a fitting part having a concave shape surrounded by the bump 15, which is a convex portion, is formed.

As shown in FIGS. 8A and 8B, in the microlens array substrate 20, on a transparent substrate 21 made of synthetic quartz or the like, a microlens array 22 is formed. Each microlens of the microlens array 22 is arranged at a position corresponding to the respective surface-emitting laser which is a unit element of the surface-emitting laser array 12. That is, each microlens, which is an optical member, is arranged on an optical path of light emitted from the corresponding surface-emitting laser, which is a semiconductor element. Output light from each surface-emitting laser enters a corresponding microlens, and approximately parallel light is emitted.

In a corner of an opposite surface 21a of the transparent substrate 21, which is a surface opposed to the surface-emitting laser array substrate 10, a pier portion 23 for defining a distance from the surface-emitting laser array substrate 10 is formed extended from the transparent substrate 21. On the bottom face of the pier portion 23, an adhesive fixture region 24 is formed. Each adhesive fixture region 24 does not necessarily have to be formed in a whole surface of the bottom face of the pier portion 23, as long as it is formed at a position opposed to the corresponding adhesive fixture region 14.

A planar shape of the adhesive fixture region 24 may be circular. The adhesive fixture region 24 may be formed of the same material as that of the adhesive fixture region 14. However, the adhesive fixture region 24 may be formed of a material other than the above-described material, in the case where it is a material which becomes wet with a bump 25 more easily than the material of the pier portion 23 (the same as the material of the transparent substrate 21).

The bump 25 is formed on the adhesive fixture region 24. A cross section of the bump 25 may have a shape including a partial circle. The bump 25 may be hemispherical. The bump 25 may be formed of, for example, a solder material such as AuSn. In this way, in the microlens array substrate 20, a fitting part having the bump 25, which is a convex portion, is formed.

In the examples of FIGS. 6, 8A and 8B, the microlens array 22 is formed on the opposite surface 21a of the transparent substrate 21 (surface on which the pier portions 23 are formed). However, the microlens array 22 does not necessarily have to be formed on the opposite surface 21a. For example, the microlens array 22 may be formed on a surface opposed to the opposite surface 21a of the transparent substrate 21.

Returning to FIG. 6, the bump 15 of the surface-emitting laser array substrate 10 adheres to the bump 25 of the microlens array substrate 20, which is opposed thereto, via the joint part 30. In more detail, the joint part 30 is provided in a region between the fitting part having a concave shape surrounded by the bump 15, which is a convex portion, and the fitting part having the bump 25, which is a convex portion. Then, the fitting part having a concave shape surrounded by the bump 15, which is a convex portion, is adhered via the joint part 30 in a state of fitting to at least a part of the fitting part having the bump 25, which is a convex portion. As the joint part 30, for example, an ultraviolet curing resin or the like may be used.

In a cross-sectional view, the vertex of the bump 25 does not make contact with the first face 11a of the semiconductor substrate 11 which is exposed in the aperture 15x of the bump 15, and the bump 25 makes contact with the two partial circles of the bump 15. Accordingly, the surface-emitting laser array substrate 10 and the microlens array substrate can be fixed via the joint part 30 in the state of being aligned with high accuracy.

In this way, in the surface-emitting laser device 1, the self-alignment structure, where the fitting part having a concave shape surrounded by the bump 15, which is a convex portion, is fitted to the fitting part having the bump 25, which is a convex portion, is employed. As a result, the surface-emitting laser array substrate 10 and the microlens array substrate 20 can be fixed in the state of being aligned with high accuracy.

Here, an example of preferred values related to the adhesive fixture regions 14 and 24 and the bumps 15 and 25 will be shown. Upon describing the example of values, the reference numerals shown in FIG. 5 will be referred appropriately.

Values of parameters are set as follows: a width of the adhesive fixture region 14, $2c_d$=200 μm, a height of each partial circle in a cross section of the bump 15, $h_d$=50 μm, a width of the adhesive fixture region 24 (diameter), $2c_u$=300 μm, and a height of a partial circle in a cross section of the bump 25, $h_u$=100 μm. From these structure parameters, using Equations (1) and (2), radii of the respective virtual circles are obtained as $r_d$=125 μm and $r_u$=163 μm. As a result, a distance p in Z-direction between centers of the two virtual circles is obtained as p=238 μm. Moreover, from Equation (3), a threshold $q_0$ for the condition of self-alignment is obtained as $q_0$=162 μm, and at this time, W=124 μm. Therefore, as a means for realizing the self-alignment structure, W can be set to be less than 124 μm.

Next, in order to form the concavity and convexity structure with solder, respective volumes will be estimated. The concavity and convexity structure can be obtained, for example, by a calculation formula, assuming that a shape of the cross section thereof is semicircle. Moreover, a solder material can be supplied by cutting a necessary area of a solder foil with thickness of 25 μm. A volume $V_u$ of an AuSn foil for forming the bump 25 on the side of the microlens array substrate 20 is obtained as 4.055×10⁶ μm³. Therefore, a 400 μm square of the AuSn foil with thickness of 25 μm is supplied.

In the same way as above, a volume $V_d$ of the bump 15 on the side of the surface-emitting laser array substrate 10 is obtained as 7.850×10⁶ μm³. Therefore, a 560 μm square of the AuSn foil with thickness of 25 μm is supplied.

[Manufacturing Method of Surface Emitting Laser Device]

FIGS. 9A to 10B are diagrams depicting an example manufacturing process of the surface-emitting laser device according to the first embodiment. At first, the surface-emitting laser array substrate 10, which is described with reference to FIGS. 7A and 7B, is made. Specifically, the semiconductor substrate 11 is prepared. The surface-emitting laser array 12 is formed approximately at the center of the first face 11a of the semiconductor substrate 11. Furthermore, at four corners of the first face 11a of the semiconductor substrate 11, a plurality of the adhesive fixture regions 14 including metallic patterns are formed.

In order to form the surface-emitting laser array 12, for example, on the first face 11a of the semiconductor substrate 11, a lower DBR (Distributed Bragg Reflector), a lower spacer layer, multiple quantum well activation layers, an upper spacer layer, an upper DBR, a contact layer and the like are laminated and formed in series by epitaxial growth or the like. Then, a predetermined region of the laminated and formed semiconductor layers is etched in a direction orthogonal to the first face 11a of the semiconductor substrate 11, and thereby a mesa structure is formed. An insulation layer is formed on a side surface of the mesa structure and on the etched region, and thereby the surface-emitting laser array 12 is formed that emits laser light in the Z-direction from a light emission surface, which is open on a top face of the mesa structure.

The adhesive fixture region 14 is formed, for example, by forming a film of gold (Au) or the like on the first face 11a of the semiconductor substrate 11 by using the vacuum deposition method, an electron beam (EB) deposition method or the like. The adhesive fixture region 14 may be formed, for example, by laminating titanium (Ti)/platinum (Pt)/gold (Au) in series from the side of the first face 11a of the semiconductor substrate 11 by using the vacuum deposition method, the electron beam (EB) deposition method or the like. However, the metallic material of the uppermost surface of the adhesive fixture region 14 is not limited to gold, but various kinds of materials which become wet with a solder may be used. In addition, the metallic pattern of the adhesive fixture region 14 is formed by a photolithography method along with an anode electrode 13, and thereby location accuracy can be enhanced.

In a case of associating with the above-described example of preferred values, as the adhesive fixture region 14, a metallic pattern having an outer shape of 524 μm square and having an aperture 15x with a width W of 124 μm square is formed. Then, on each of the adhesive fixture regions 14, an AuSn foil of 560 μm square with thickness of 25 μm, which are obtained as above, is arranged and heated up to about 300° C., and thereby the bump 15 having two partial circles in the cross section of the fitting structure is formed. Upon heating the AuSn foil, it is important to reduce oxygen density as much as possible, and is preferably heated in a nitrogen atmosphere.

Next, the microlens array substrate 20, which is described with reference to FIGS. 8A and 8B, is made. The microlens array 22 and the pier portion 23 can be formed, for example, by using a known method combining photolithography and etching using quartz. Moreover, the adhesive fixture region 24 can be formed with the same material and by the same method as the adhesive fixture region 24.

In a case of associating with the above-described example of preferred values, as the adhesive fixture region 24, a metallic pattern with a diameter of 300 μm is formed. Then, on each of the adhesive fixture regions 24, an AuSn foil of 400 μm square with thickness of 25 μm, which are obtained as above, is arranged and heated up to 300° C., and thereby the bump 25, a cross section of which has a shape of a partial circle (for example, hemispherical), is formed. Upon heating the AuSn foil, it is important to reduce oxygen density as much as possible, and is preferably heated in a nitrogen atmosphere.

Figure 9A:
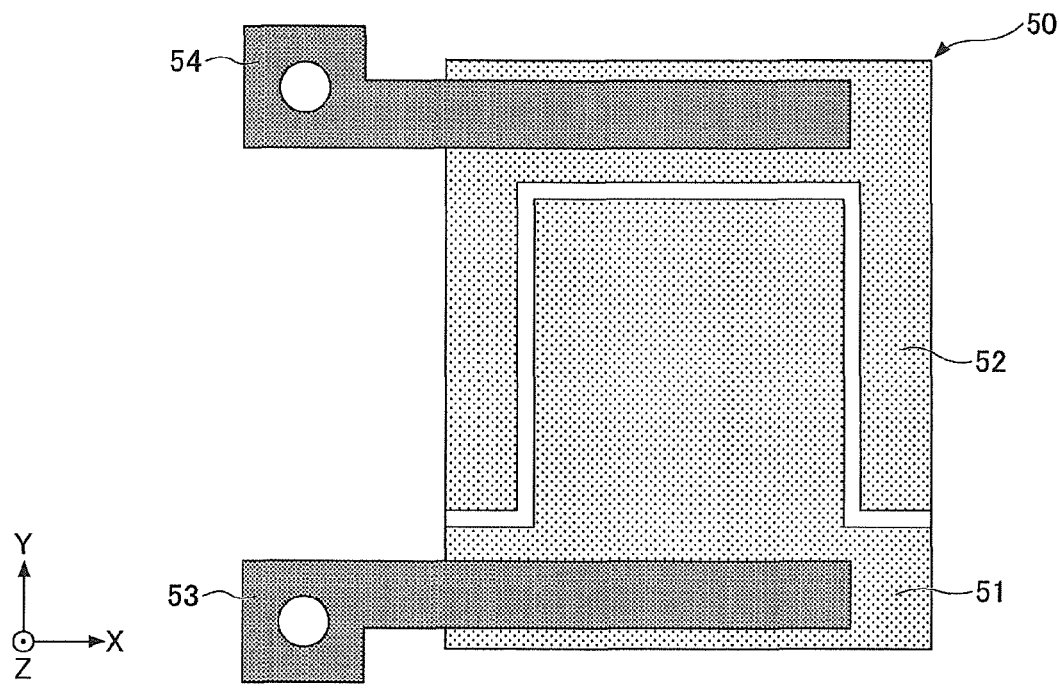
FIGS. 9A and 9B are diagrams depicting a first example manufacturing process of a surface-emitting laser device according to the first embodiment.

Next, as shown in FIG. 9A, a heat sink substrate 50 for mounting the surface-emitting laser array substrate 10 is prepared. The heat sink substrate 50 is insulative. On the surface of the heat sink substrate 50 are formed, a wiring pattern 51 for mounting a cathode electrode of the surface-emitting laser array substrate 10 and a wiring pattern 52 for performing wire bonding for the anode electrode 13. Moreover, to the wiring pattern 51 an electric current terminal 53 is connected, and to the wiring pattern 52 an electric current terminal 54 is connected. The wiring patterns 51 and 52 can be formed of, for example, gold (Au) or the like. Moreover, the electric current terminals 53 and 54 can be formed of, for example, copper (Cu) or the like. The electric current terminals 53 and 54 may be formed in the post process.

Figure 9B:
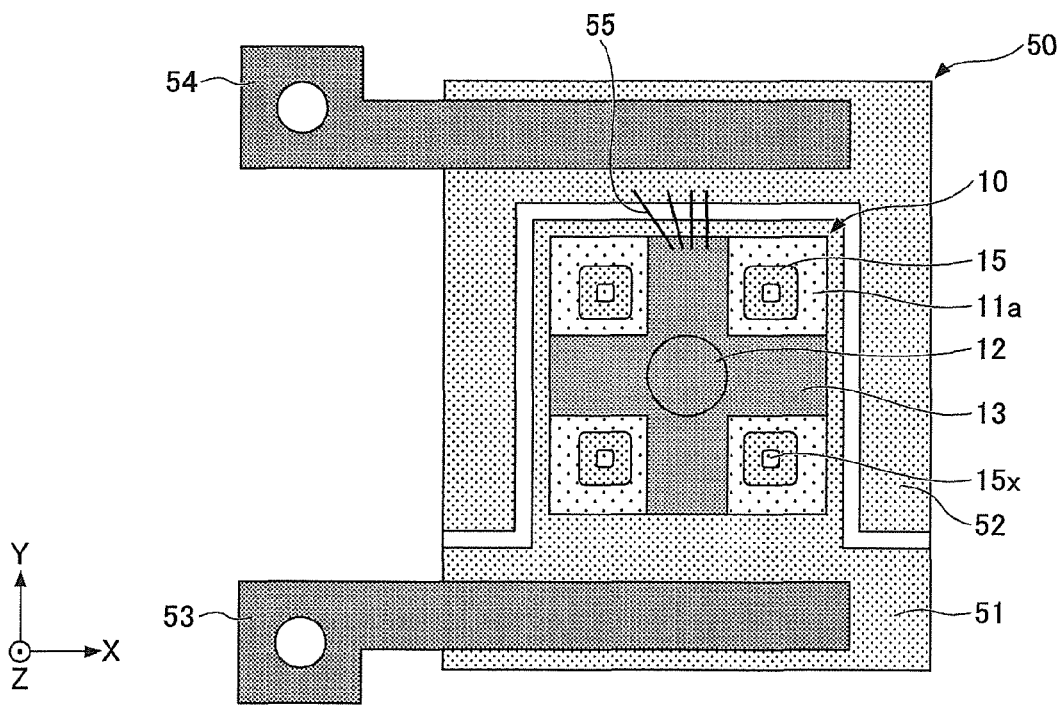

Next, as shown in FIG. 9B, the surface-emitting laser array substrate 10, in which the bump 15 is arranged on the adhesive fixture regions 14, is die-bonded to the wiring pattern 51 of the heat sink substrate 50 by a die-bond agent. Then, the anode electrode 13 of the die-bonded surface-emitting laser array substrate 10 is wire-bonded to the wiring pattern 52 of the heat sink substrate 50 by using a metal wire 55. For the metal wire 55, for example, a gold wire, a copper wire or the like may be used.

Figure 10A:
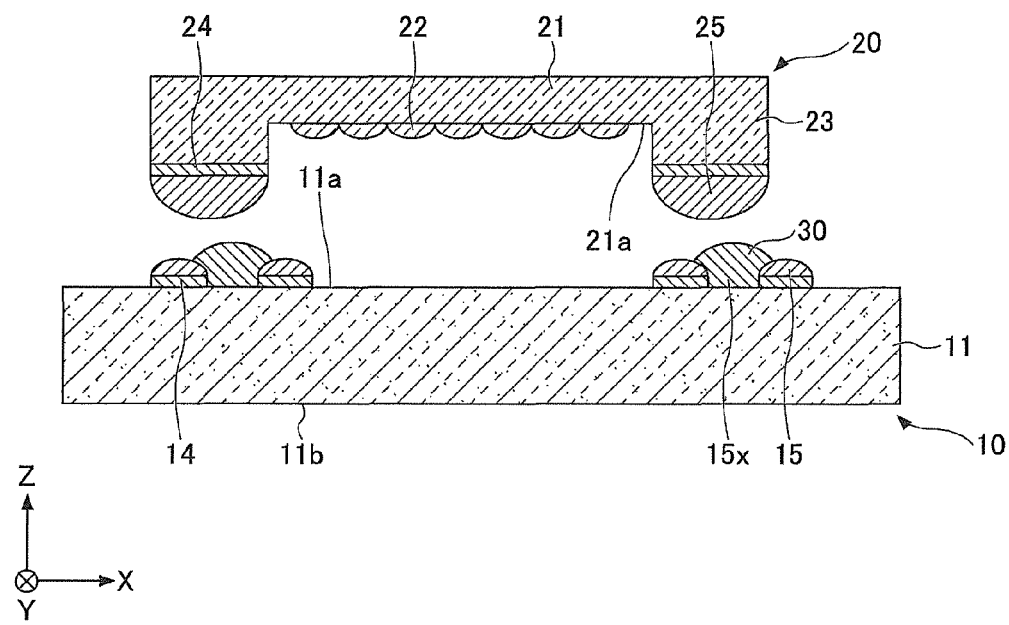
FIGS. 10A and 10B are diagrams depicting a second example manufacturing process of the surface-emitting laser device according to the first embodiment.

Next, as shown in FIG. 10A, the microlens array substrate 20 is mounted on the surface-emitting laser array substrate 10. At first, in the aperture 15x of the surface-emitting laser array substrate 10, appropriate quantities of an ultraviolet curing resin are applied as the joint part 30 for fixing. However, the ultraviolet curing resin may be applied both on the side of the surface-emitting laser array substrate 10 and on the side of the microlens array substrate 20. Alternatively, the ultraviolet curing resin may not be applied in this process, but may be applied between the surface-emitting laser array substrate and the microlens array substrate 20 after the self-alignment of the microlens array substrate is performed.

In this way, in a case of performing final fixing by using the ultraviolet curing resin, it is necessary to prevent a wet solder from spreading when the ultraviolet curing resin is applied. In the embodiments, because the fitting part with a concave shape having the aperture 15x surrounded by the bump 15, which is a convex portion, is formed, a ultraviolet curing resin can be retained inside the aperture 15x by a surface tension, and thereby the spreading of the wet ultraviolet curing resin can be prevented.

Next, the microlens array substrate 20 is adsorbed by, for example, a collet of a die bonder, and retained in the air. Then, a position of the microlens array substrate 20 is adjusted in the air, a temporary alignment is performed so that the bump 25 of the microlens array substrate 20 comes to a position opposite to the bump 15 of the surface-emitting laser array substrate 10, and an appropriate weight is applied so as to cause the bump 15 and the bump 25 to contact each other.

Figure 10B:
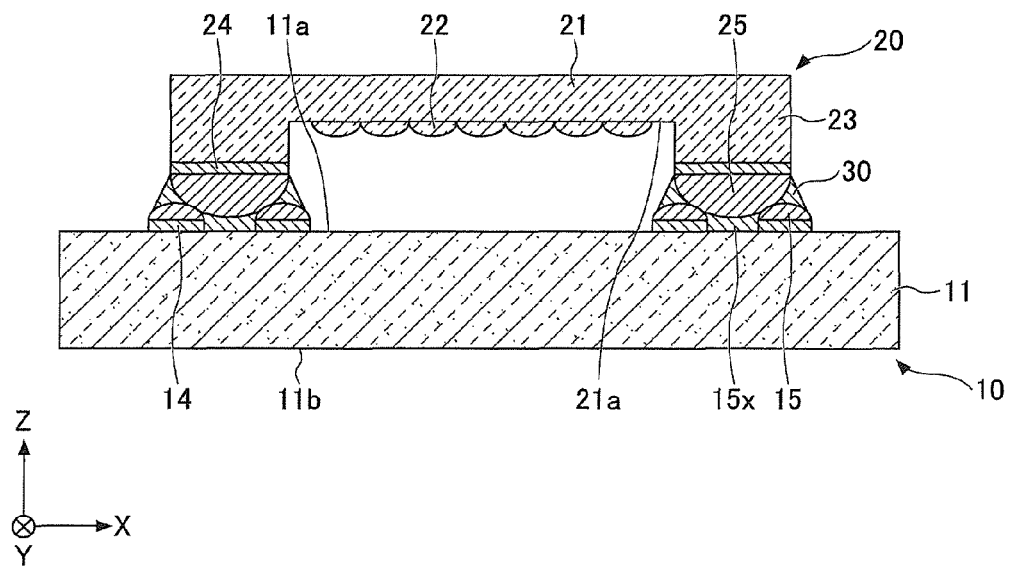

At the next moment, as shown in FIG. 10B, even if a position gap occurs between the microlens array substrate 20 and the surface-emitting laser array substrate 10, according to the applied weight, the bump 25 which is a convex portion slides down the surface of the fitting part having a concave shape surrounded by the bump 15, which is a convex portion. Accordingly, the microlens array substrate 20 and the surface-emitting laser array substrate 10 are aligned. After the alignment, in a state of holding the microlens array substrate 20 by the collet or the like of the die bonder, ultraviolet light is emitted, the ultraviolet curing resin is caused to cure, and to the joint part 30 is formed. Accordingly, the self-alignment of the microlens array substrate 20 to the surface-emitting laser array substrate 10 ends.

In this way, in the embodiments, the fitting part including the bump 25 which is a convex portion and the fitting part having a concave shape surrounded by the bump 15 which is a convex portion are fitted to each other, and thereby the self-alignment of the microlens array substrate 20 to the surface-emission laser array substrate 10 is performed.

In the above-described method, only by controlling surface tension and supply quantity of solder, a fitting structure with quite high accuracy can be formed. As a result, a surface-emitting laser device 1 with low manufacturing cost and high reliability can be provided. Moreover, especially because it is not necessary to scrape the surface-emitting laser array substrate 10 upon forming the fitting part having a concave shape, the fitting structure can be formed without damaging the surface-emitting laser array 12 or the like of the surface-emitting laser array substrate 10. It is preferable.

Moreover, because the surface-emitting laser array substrate 10 and the microlens array substrate 20 are aligned to each other with high accuracy, laser light emitted from each surface-emitting laser configuring the surface-emitting laser array 12 definitely enters each microlens configuring the microlens array 22 and focused. As a result, increase in the output of the surface-emitting laser device 1 is attained.

Conventionally, in an optical device including a semiconductor element that emits light (light emitting element such as surface-emitting laser array) and an optical member arranged on an optical path of the light emitted from the semiconductor element, it is difficult to align the semiconductor element with the optical member with high accuracy. Similarly, in an optical device including a semiconductor element that receives light (light reception element such as a photodiode) and an optical member arranged on an optical path of the light entering the semiconductor element, it is difficult to align the semiconductor element with the optical member with high accuracy.

According to the first embodiment of the present invention, an optical device in which an optical member is aligned with a semiconductor element that emits or receives light with high accuracy can be provided.

<Second Embodiment>

In a second embodiment, an example of the fitting structure different from the first embodiment will be shown. In the second embodiment, an explanation for the member which has already been described in the previous embodiment may be omitted.

Figure 11:
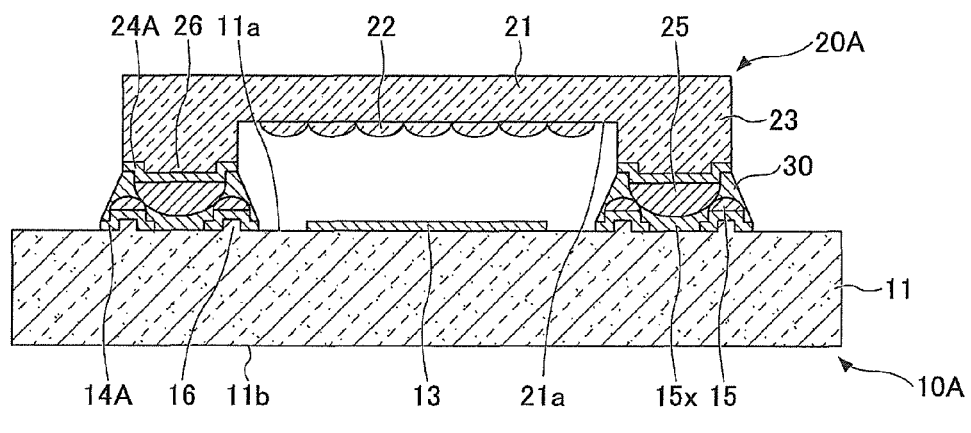
FIG. 11 is a cross-sectional view depicting an example main part of a surface-emitting laser device according to a second embodiment.
Figure 12A:
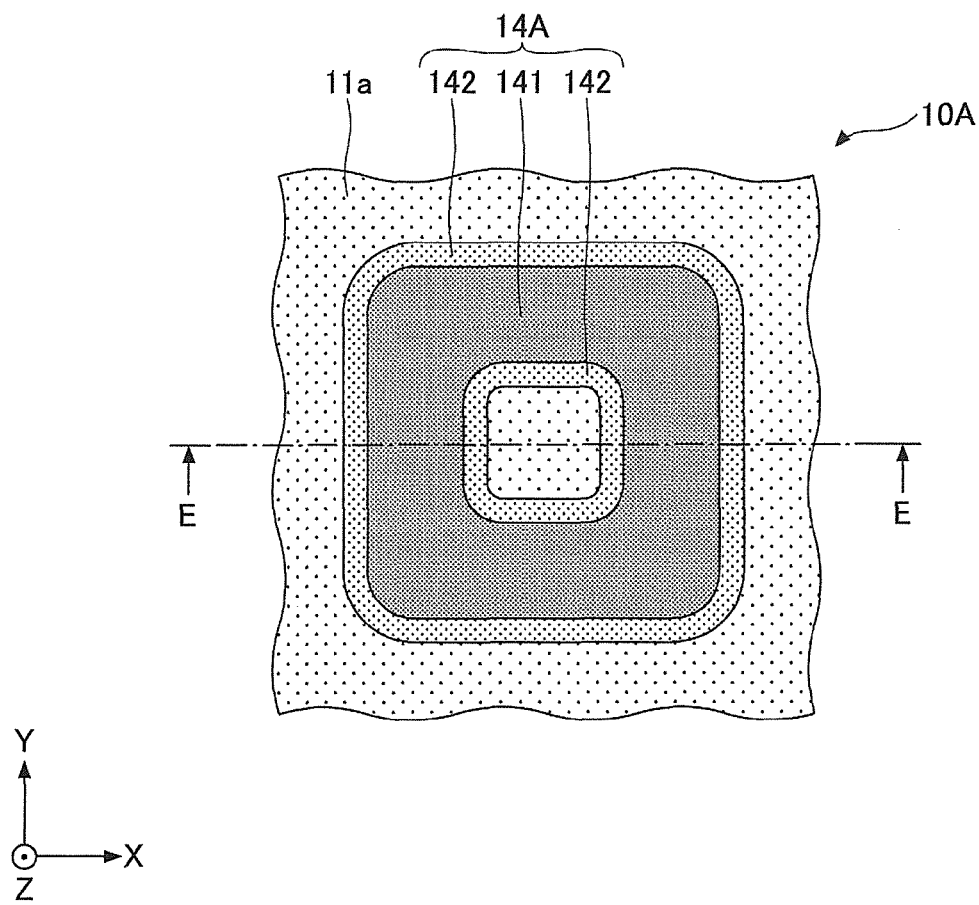
FIGS. 12A and 12B are diagrams depicting an example adjacent to an adhesive fixture region of the surface-emitting laser array substrate of FIG. 11.
Figure 12B:
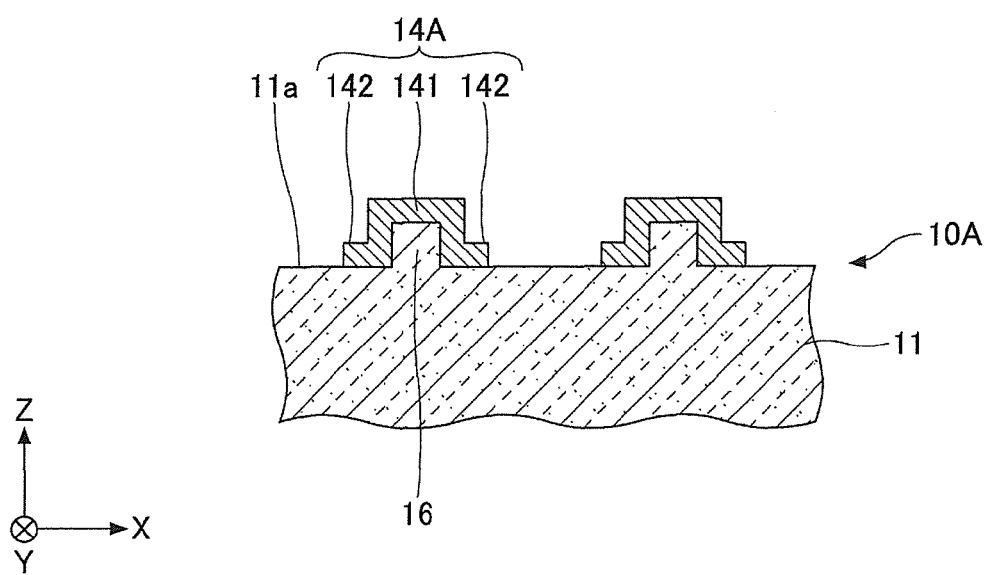
Figure 13A:
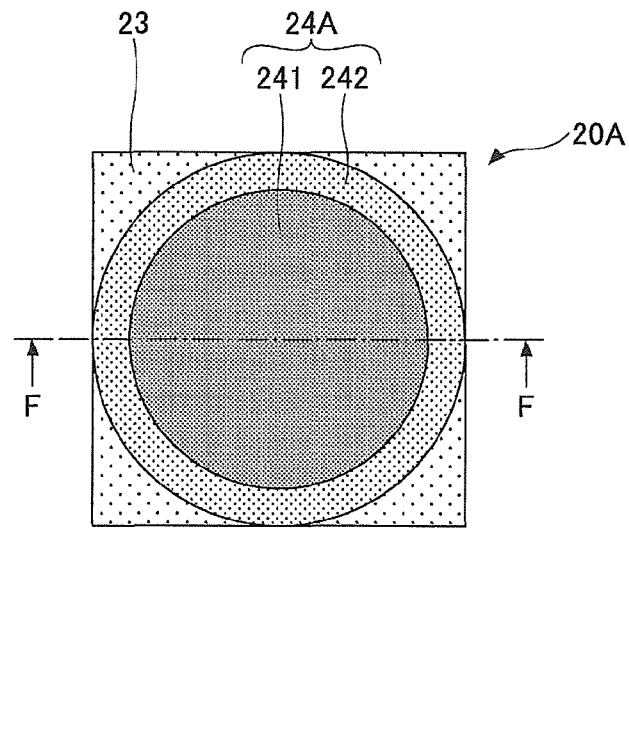
FIGS. 13A and 13B are diagrams depicting an example adjacent to an adhesive fixture region of the microlens array substrate of FIG. 11.
Figure 13B:
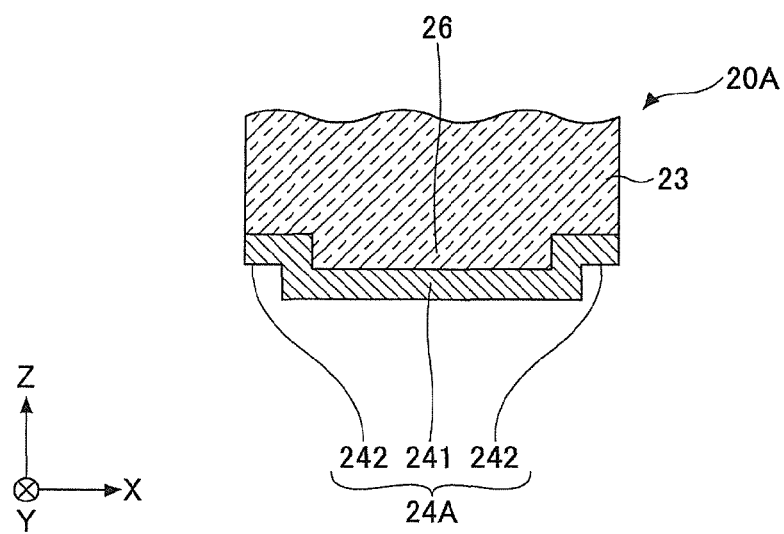

FIG. 11 is a cross-sectional view depicting an example main part of a surface-emitting laser device according to the second embodiment. FIGS. 12A and 12B are diagrams depicting an example adjacent to an adhesive fixture region of the surface-emitting laser array substrate shown in FIG. 11. FIG. 12A is a planar view, and FIG. 12B is a partial cross-sectional view cut along a line E-E in FIG. 12A. FIGS. 13A and 13B are diagrams depicting an example adjacent to an adhesive fixture region of the microlens array substrate shown in FIG. 11. FIG. 13A is a planar view, and FIG. 13B is a partial cross-sectional view cut along a line F-F in FIG. 13A.

As shown in FIGS. 11 to 13B, the surface-emitting laser device 1A according to the second embodiment is different from the surface-emitting laser device 1 (See FIG. 6 or the like) in that the surface-emitting laser array substrate 10 and the microlens array substrate 20 are replaced by a surface-emitting laser array substrate 10A and a microlens array substrate 20A, respectively.

At four corners of first face 11a of a semiconductor substrate 11 of the surface-emitting laser array substrate 10A, box-shaped step portions 16 are formed by a semiconductor layer of a surface-emitting laser array 12. Then, adhesive fixture regions 14A made with metallic patterns are formed so as to cover the respective step portions 16 and peripheries thereof.

The adhesive fixture region 14A includes a protrusion portion 141 having a shape corresponding to the step portion 16 and a peripheral portion 142 formed on both sides of the protrusion portion 141. On the protrusion portion 141 a bump 15 is formed. The adhesive fixture region 14A may be formed of, for example, the same material as the adhesive fixture region 14. In this way, in the surface-emitting laser array substrate 10A, a fitting part having a concave shape surrounded by the bump 15, which is a convex portion, is formed on the step portion 16 and the protrusion portion 141.

On a bottom face of a pier portion 23 of the microlens array substrate 20A, a step portion 26 having a cylindrical shape is formed of the same material as the microlens array substrate 20A. Then, adhesive fixture regions 24A having metallic patterns are formed so as to cover the respective step portions 26 and peripheries thereof.

The adhesive fixture region 24A includes a protrusion portion 241 having a shape corresponding to the step portion 26 and a peripheral portion 242 formed around the protrusion portion 241. On the protrusion portion 241 a bump 25 is formed. The adhesive fixture region 24A may be formed of, for example, the same material as the adhesive figure region 24. In this way, in the microlens array substrate 20A, a fitting part including the bump 25, which is a convex portion, is formed on the step portion 26 and the protrusion portion 241.

The bump 15 of the surface-emitting laser array substrate 10A adheres to the bump 25 of the microlens array substrate 20A, which is opposed thereto, via the joint part 30, in the same way as the first embodiment.

The step portion 16 of the surface-emitting laser array substrate 10A can be formed with a mesa structure simultaneously in the process of forming the mesa structure of the surface-emitting laser array 12 by etching. Therefore, the step portion 16 can be formed with the highest accuracy with the mesa structure (light emitting part) without damaging the surface-emitting laser array 12 of the surface-emitting laser array substrate 10A. After forming the step portion 16, the adhesive fixture region 14A having a metallic pattern is formed so as to cover the step portion 16. The protrusion portion 141 of the adhesive fixture region 14A formed in a shape corresponding to the step portion 16 also has a highly accurate positional relationship with the mesa structure (light emitting part).

In the same way as above, the step portion 26 of the microlens array substrate 20A can be formed with a microlens array 22 simultaneously in the process of forming the microlens array 22 by etching. Therefore, the step portion 26 can be formed with the highest accuracy with the microlens array 22 without damaging the microlens array 22 of the microlens array substrate 20A. After forming the step portion 26, the adhesive fixture region 24A having a metallic pattern is formed so as to cover the step portion 26. The protrusion portion 241 of the adhesive fixture region 24A formed in a shape corresponding to the step portion 26 also has a highly accurate positional relationship with the microlens array 22.

In a process of forming a solder bump 15, spreading of a wet melted solder is prevented by a difference in level between the protrusion portion 141 and the peripheral portion 142. Then, a bump 15 is formed only on a top face the protrusion portion 141. Similarly, in a process of forming a solder bump 25, spreading of a wet melted solder is prevented by a difference in level between the protrusion portion 141 and the peripheral portion 142. Then, a bump 25 is formed only on a bottom face of the protrusion portion 241. As a result, it is possible to align the surface-emitting laser array substrate 10A with the microlens array substrate 20A with high accuracy.

<Third Embodiment>

In a third embodiment, an example of the fitting structure different from the first embodiment will be shown. In the third embodiment, an explanation for the member which has already been described in the previous embodiments may be omitted.

Figure 14:
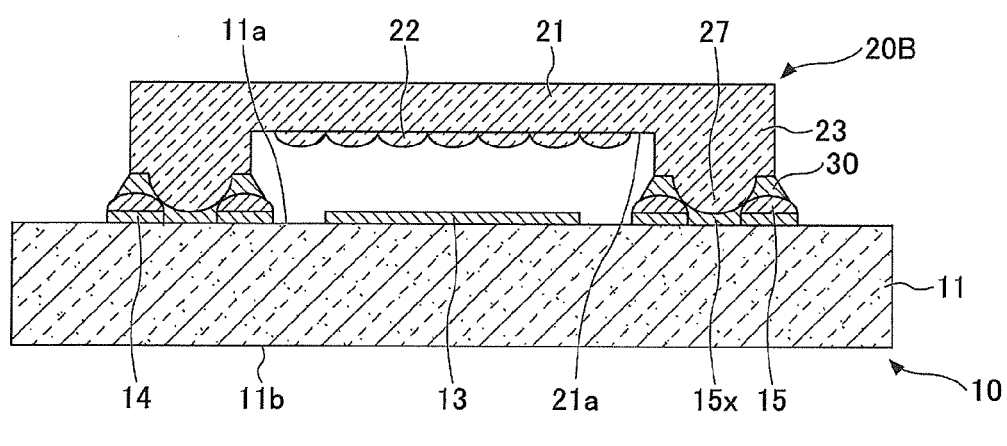
FIG. 14 is a cross-sectional view depicting an example main part of a surface-emitting laser device according to a third embodiment.

FIG. 14 is a cross-sectional view depicting an example main part of a surface-emitting laser device according to the third embodiment. As shown in FIG. 14, the surface-emitting laser device 1B according to the third embodiment is different from the surface-emitting laser device 1 (See FIG. 6 or the like) in that the microlens array substrate 20 is replaced by a microlens array substrate 20B.

On a bottom face of a pier portion 23 of the microlens array substrate 20B, a protrusion portion 27 is formed of the same material as the microlens array substrate 20B. A cross section of the protrusion portion 27 may have a shape of a partial circle. The protrusion portion 27 may be hemispherical.

Because the protrusion portion 27 combines functions of an adhesive fixture region and a bump, the microlens array substrate 20B is not provided with an adhesive fixture region and a bump. That is, the protrusion portion 27 itself is a fitting part. In this way, on the microlens array substrate 20B, the fitting part having the protrusion portion 27.

The bump 15 of the surface-emitting laser array substrate 10 and the protrusion portion 27 of the microlens array substrate 20B, which is opposed thereto, are adhered to each other via the joint part 30.

The protrusion portion 27 of the microlens array substrate 20B can be formed with the microlens array 22 simultaneously in the process of forming the microlens array 22 by etching. Therefore, the protrusion portion 27 can be formed with the highest accuracy with the microlens array 22 without damaging the microlens array 22 of the microlens array substrate 20B. As a result, the surface-emitting laser array substrate 10 and the microlens array substrate 20B are aligned with each other with high accuracy.

<Fourth Embodiment>

In a fourth embodiment, an example of the adhesive fixture region different from the first embodiment will be shown. In the fourth embodiment, an explanation for the member which has already been described in the previous embodiments may be omitted.

Figure 15:
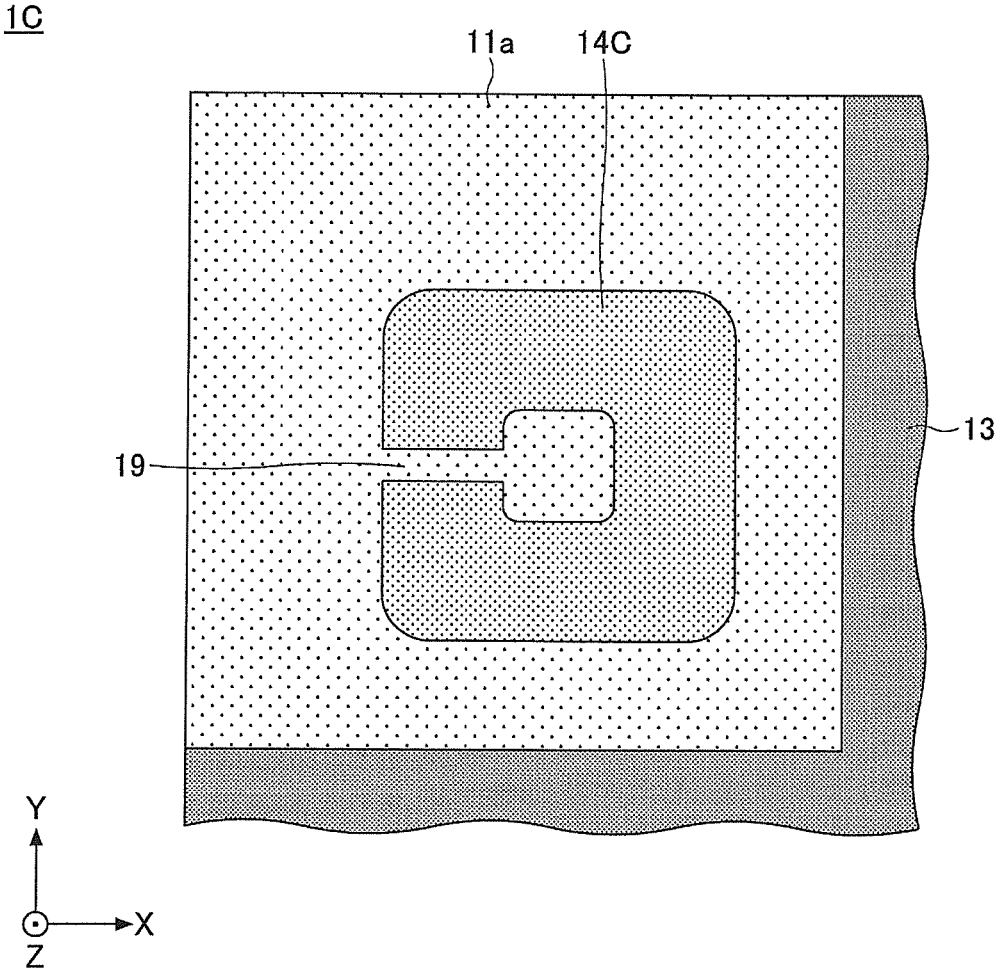
FIG. 15 is a partial plan view depicting an example adjacent to an adhesive fixture region of a surface-emitting laser device according to a fourth embodiment.

FIG. 15 is a partial plan view depicting an example adjacent to an adhesive fixture region of a surface-emitting laser device according to the fourth embodiment. Because a cross-sectional view of a main part of the surface-emitting laser device according to the fourth embodiment is the same as FIG. 6, depiction will be omitted.

As shown in FIG. 15, the surface-emitting laser device 1C is different from the surface-emitting laser device 1 (See FIG. 6 or the like) in that the adhesive fixture region 14 is replaced by an adhesive fixture region 14C.

The adhesive fixture region 14C may be formed of, for example, the same material of the adhesive fixture region 14. In a planar view, the adhesive fixture region 14C is provided with a gap portion 19 for exposing the first face 11a of the semiconductor substrate 11.

On the adhesive fixture region 14C a bump is formed in the same way as in FIG. 6 or the like, but the bump 15 is not formed on the gap portion 19. At the center of the bump 15, an aperture 15x is provided in the same way as in FIG. 6 or the like, and a part surrounded by the bump 15 is a concave portion with a box shape. A part of the aperture 15x is connected to (communicates with) a region outside the part where the bump 15 is formed via the gap portion 19 held by the bump 15.

In this way, the gap portion 19 is provided in the adhesive fixture region 14C, and thereby when the surface-emitting laser array substrate and the microlens array substrate are fixed to each other via the joint part 30 including an ultraviolet curing resin, an excess ultraviolet curing resin can be put out from the gap portion. Therefore, the surface-emitting laser array substrate and the microlens array substrate are adhered surely to each other.

<Fifth Embodiment>

In a fifth embodiment, another example of the fitting structure different from the first embodiment will be shown. In the fifth embodiment, an explanation for the member which has already been described in the previous embodiments may be omitted.

Figure 16A:
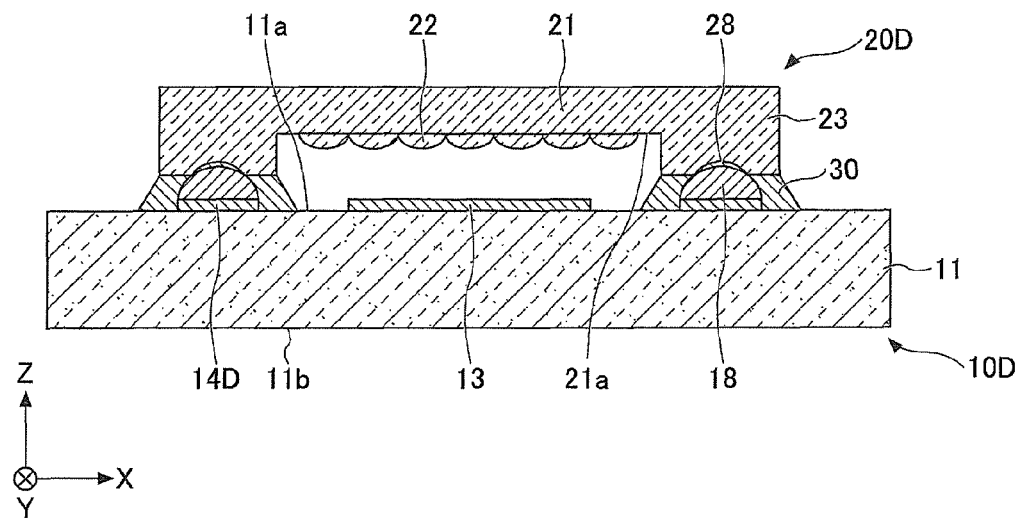
FIGS. 16A and 16B are cross-sectional views depicting an example main part of a surface-emitting laser device according to a fifth embodiment.
Figure 16B:
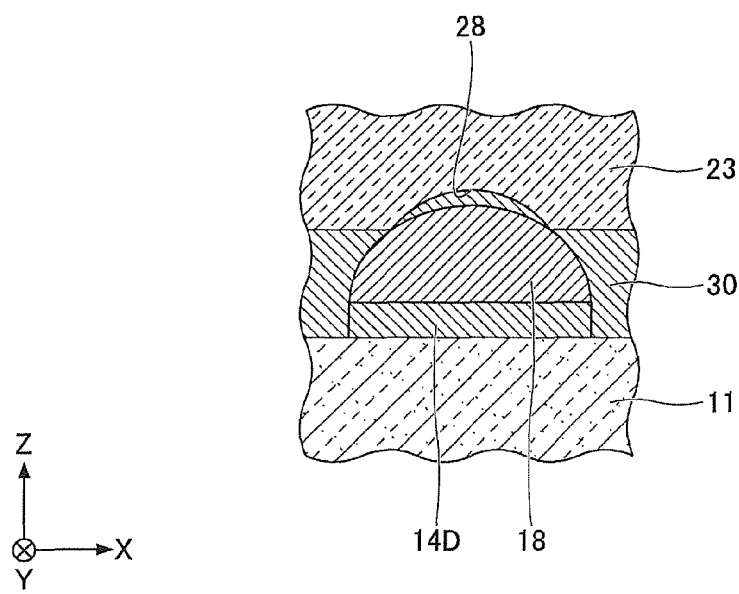

FIGS. 16A and 16B are cross-sectional views depicting an example main part of a surface-emitting laser device 1D according to the fifth embodiment. FIG. 16A is a cross-sectional view of the entire surface-emitting laser device 1D, and FIG. 16B is a partial cross-sectional view adjacent to the fitting structure of the surface-emitting laser device 1D.

The surface emitting laser device 1D is different from the surface-emitting laser device 1 (See FIG. 6 or the like) in that the surface-emitting laser array substrate 10 is replaced by a surface-emitting laser array substrate 10D and the microlens array substrate 20 is replaced by a microlens array substrate 20D.

At four corners of first face 11a of a semiconductor substrate 11 of the surface-emitting laser array substrate 10D, adhesive fixture regions 14D, each of which has a circular planar shape, are formed. On the adhesive fixture region 14D, a bump 18 having a shape, a cross section of which has a partial circle (e.g. hemispherical), is formed. The adhesive fixture region 14D and the bump 18 can be formed of, for example, the same material of the adhesive fixture region 14 and the bump 15. In this way, in the surface-emitting laser array substrate 10D, a fitting part including the bump 18, which is a convex portion, is formed.

On a bottom face of a pier portion 23 of the microlens array substrate, a bowl-shaped hollow portion 28 is formed. Because the hollow portion 28 combines functions of an adhesive fixture region and a bump, the microlens array substrate 20D is not provided with an adhesive fixture region and a bump. That is, the hollow portion 28 itself is a fitting part. In this way, in the microlens array substrate 20D, the fitting part including the hollow portion 28 is formed.

The bump 18 of the surface-emitting laser array substrate 10D adheres to the hollow portion 28 of the microlens array substrate 20D, which is opposed thereto, via the joint part 30, in the same way as the first embodiment.

As shown enlarged in FIG. 16B, the bump 18 of the surface-emitting laser array substrate 10D preferably makes contact with the hollow portion 28 of the microlens array substrate 20D at two points in a cross-sectional view.

The hollow portion 28 of the microlens array substrate 20D can be formed with a microlens array 22, simultaneously, in a process of forming the microlens array 22 by etching. Therefore, the hollow portion 28 can be formed with the highest accuracy with the microlens array 22 without damaging the microlens array 22 of the microlens array substrate 20D. As a result, the surface-emitting laser array substrate 10D and the microlens array substrate 20D are aligned with each other with high accuracy.

In this way, a fitting part including a portion having a convex shape may be arranged on the side of the surface-emitting laser array substrate, and a fitting part including a portion having a concave shape may be arranged on the side of the microlens array substrate. Also in this case, the same effect is provided as in the case where the fitting part including the portion having a concave shape is arranged on the side of the surface-emitting laser array substrate, and the fitting part including the portion having a convex shape is arranged on the side of the microlens array substrate.

The fitting part including the portion having a concave shape arranged on the side of the microlens array substrate may be, for example, a bump having a box shape formed on the adhesive fixture region, in the same way as FIGS. 7A and 7B.

<Sixth Embodiment>

In a sixth embodiment, an example of a laser processing machine using the surface-emitting laser device as an optical device will be described. In the sixth embodiment, an explanation for the member which has already been described in the previous embodiments may be omitted.

Figure 17:
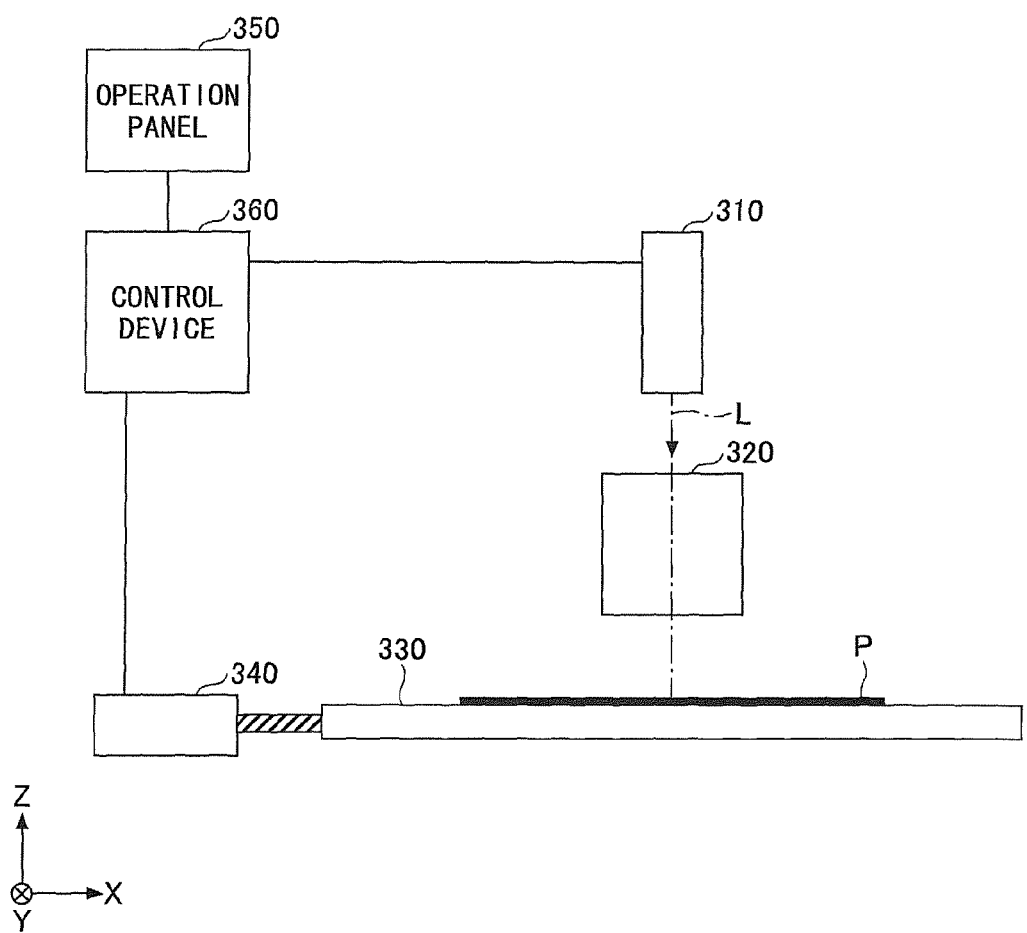
FIG. 17 is a diagram depicting an example main part of a laser processing machine according to a sixth embodiment.

FIG. 17 is a diagram depicting an example main part of the laser processing machine according to the sixth embodiment. As shown in FIG. 17, the laser processing machine 300 includes roughly an optical device 310, an optical system 320, a table 330, a table driving device 340, an operation panel 350 and a control device 360. On the table 330, an object P to be processed is placed.

The optical device 310 includes a light-emitting element (laser) that emits light as a semiconductor element, and emits laser light L based on an instruction from the control device 360. The optical device 310 may include any of the surface-emitting laser devices 1, 1A, 1B, 1C and 1D. In this case, laser light emitted from the surface emitting laser array 12 is condensed by the microlens array 22 and emitted as the laser light L from the optical device 310.

The optical system 320 is arranged on an optical path of the laser light L emitted from the optical device 310, and guides light to the object P. By the optical system 320, the laser light L is condensed adjacent to a surface of the object P placed on the table 330. The table driving device 340 can move the table 330 in the X-axis direction, the Y-axis direction and the Z-axis direction based on an instruction from the control device 360.

The operation panel 350 includes a plurality of keys with which an operator performs various settings and a display unit for displaying various information. The control device 360 can control the optical device 310 and the table driving device 340 based on the various information from the operation panel 350.

The laser processing machine 300 is provided with the surface-emitting laser device 1 or the like as the optical device 310. In the surface-emitting laser device 1, a surface-emitting laser array substrate 10 and a microlens array substrate 20 are aligned with each other with high accuracy. Therefore, laser light emitted from a surface-emitting laser array 12 definitely enters a microlens array 22 and focused, and output of the surface-emitting laser device 1 is high-power. As a result, the laser processing device 300 can perform processing (e.g. cutting) efficiently. The laser processing device 300 may include a plurality of optical devices 310.

Further, the present invention is not limited to these embodiments, but various variations and modifications may be made without departing from the scope of the present invention.

For example, in the embodiments, the surface-emitting laser device including the surface-emitting laser array substrate and the microlens array substrate is described. However, the present invention can be applied to a surface-emitting laser device including a surface-emitting laser substrate and a microlens substrate. That is, in the surface-emitting laser device may include a surface-emitting laser or a plurality of surface-emitting lasers, and may include a microlens or a plurality of microlenses.

Moreover, a light source device such as the surface-emitting laser device 1 can be applied to a light irradiation apparatus using laser light other than a laser processing machine. Such a light irradiation apparatus includes, for example, a laser ignition apparatus that focuses light in an internal combustion engine, a laser annealing apparatus that focuses light at an object to be heated, a display apparatus that displays an image on a screen, and the like.

What is claimed is:

1. An optical device comprising:
   a semiconductor element configured to emit emission light or to receive incident light, the semiconductor element including a first fitting part including a portion having a convex shape in a first region;
   an optical member arranged on an optical path of the emission light emitted from the semiconductor element or the incident light entering the semiconductor element, the optical member including a second fitting part configured to be fitted to at least a part of the portion having the convex shape, the first region being opposed to the optical member; and
   a joint part configured to join the semiconductor element and the optical member, arranged between the first fitting part and the second fitting part,
   wherein each of (a) the second fitting part and (b) the first fitting part including the portion having the convex shape is disposed non-overlapping with the optical path of the emission light.

2. The optical device according to claim 1,
   wherein one of the first fitting part and the second fitting part includes a concave portion, at least a part of which is surrounded by a first convex portion, and
   wherein the other of the first fitting part and the second fitting part includes a second convex portion, at least a part of which is configured to contact the first convex portion.

3. The optical device according to claim 2, wherein the first fitting part includes the first convex portion, and the portion having the convex shape is the first convex portion.

4. The optical device according to claim 2, wherein at least one of the first convex portion and the second convex portion is made of a metallic material.

5. The optical device according to claim 2,
   wherein the semiconductor element includes a semiconductor layer, and
   wherein the first fitting part is formed on a first step portion of the semiconductor layer.

6. The optical device according to claim 2,
   wherein a second step portion is formed of a material which the optical member is made of, and
   wherein the second fitting part is formed on the second step portion.

7. The optical device according to claim 2, wherein the second fitting part is formed of a material, which the optical member is made of.

8. The optical device according to claim 2, wherein at least one of cross sections of the first convex portion and the second convex portion has a shape including a part of a circle.

9. The optical device according to claim 2,
   wherein the concave portion includes an aperture surrounded by the first convex portion, and
   wherein the aperture is a regular n-sided polygon, where n is an integer greater than or equal to three, or a circle.

10. The optical device according to claim 2,
    wherein the concave portion includes an aperture surrounded by the first convex portion, and
    wherein a part of the aperture communicates with an outside of the first convex portion via a gap portion of the first convex portion.

11. A light irradiation apparatus for irradiating an object with light comprising:
    the optical device according to claim 1, wherein the semiconductor element is a light-emitting element configured to emit the light; and
    an optical system arranged on an optical path of the light emitted from the optical device, and configured to guide the light to the object.

12. An optical device comprising:
    a semiconductor element configured to emit emission light or to receive incident light, including a first fitting part including a portion having a convex shape in a first region;
    an optical member arranged on an optical path of the emission light emitted from the semiconductor element or the incident light entering the semiconductor element, including a second fitting part configured to be fitted to at least a part of the portion having the convex shape, the first region being opposed to the optical member; and
    a joint part configured to join the semiconductor element and the optical member, arranged between the first fitting part and the second fitting part,
    wherein the semiconductor element includes a semiconductor layer, and
    wherein the first fitting part is formed on a first step portion of the semiconductor layer.

* * * * *